(12) United States Patent
Chan et al.

(10) Patent No.: US 9,092,194 B2
(45) Date of Patent: Jul. 28, 2015

(54) ELECTRONIC DEVICE

(71) Applicants: Hsiao-Ling Chan, Taipei (TW); Yung-Hsiang Chen, Taipei (TW); Hsin Lu, Taipei (TW); Wei-Chih Hsu, Taipei (TW); Chien-I Lin, Taipei (TW); Kun-Yen Liu, Taipei (TW)

(72) Inventors: Hsiao-Ling Chan, Taipei (TW); Yung-Hsiang Chen, Taipei (TW); Hsin Lu, Taipei (TW); Wei-Chih Hsu, Taipei (TW); Chien-I Lin, Taipei (TW); Kun-Yen Liu, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 211 days.

(21) Appl. No.: 13/672,659

(22) Filed: Nov. 8, 2012

(65) Prior Publication Data
US 2013/0201649 A1 Aug. 8, 2013

Related U.S. Application Data

(60) Provisional application No. 61/596,707, filed on Feb. 8, 2012.

(51) Int. Cl.
*G06F 1/16* (2006.01)
*H05K 5/02* (2006.01)

(52) U.S. Cl.
CPC ............ *G06F 1/1633* (2013.01); *G06F 1/1616* (2013.01); *G06F 1/1675* (2013.01); *H05K 5/0217* (2013.01)

(58) Field of Classification Search
USPC .......... 361/755, 752, 679.01–679.09, 679.27, 361/679.28; 455/575.1–575.4; 400/472.691; 312/223.1–223.2
See application file for complete search history.

(56) References Cited

U.S. PATENT DOCUMENTS

| 6,665,173 | B2 * | 12/2003 | Brandenberg et al. ... 361/679.09 |
| 6,816,365 | B2 * | 11/2004 | Hill et al. ................. 361/679.44 |
| 6,850,226 | B2 * | 2/2005 | Finke-Anlauff .............. 345/169 |
| 2002/0077161 | A1 * | 6/2002 | Eromaki ....................... 455/575 |
| 2005/0274786 | A1 * | 12/2005 | Hwang et al. ............. 235/145 R |

FOREIGN PATENT DOCUMENTS

| TW | 200906205 | 2/2009 |
| TW | M380509 | 5/2010 |
| TW | M420159 | 1/2012 |

* cited by examiner

*Primary Examiner* — Tuan T Dinh
*Assistant Examiner* — Rockshana Chowdhury
(74) *Attorney, Agent, or Firm* — Jianq Chyun IP Office

(57) ABSTRACT

An electronic device includes a base, a rotating element and a sliding element. The rotating element is pivoted to the base. The sliding element is slidably disposed on the base. When the rotating element is rotated relative to the base and an included angle between the two is greater than a specific angle, the sliding element slides from a first position to a second position relative to the base.

19 Claims, 23 Drawing Sheets

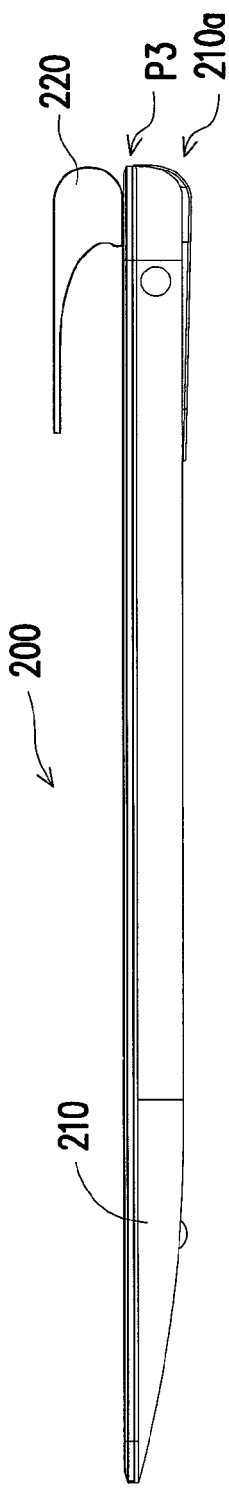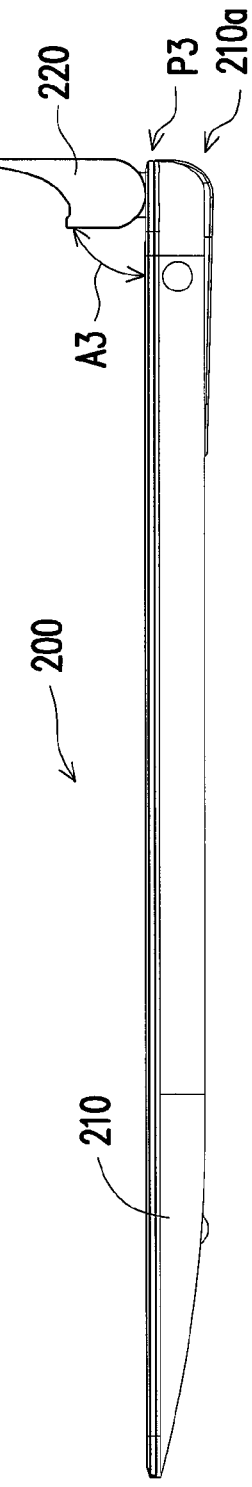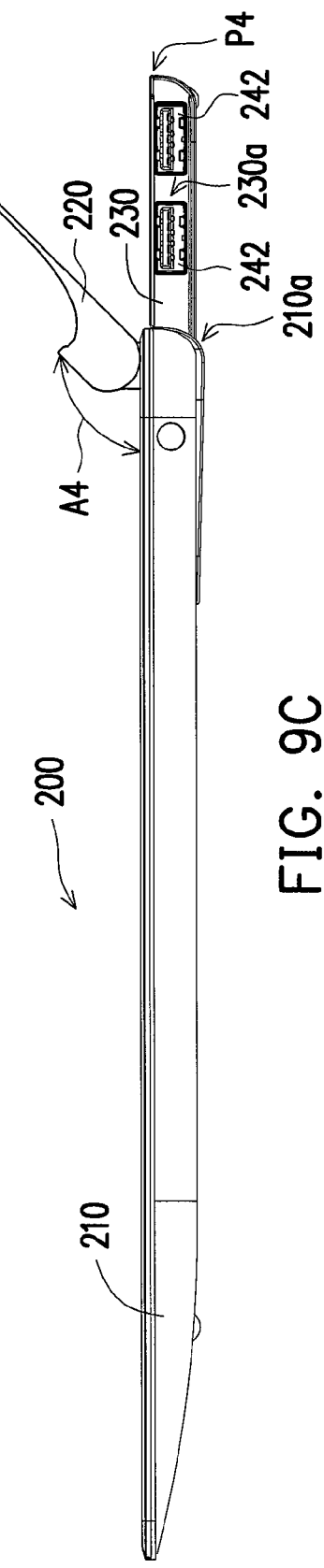

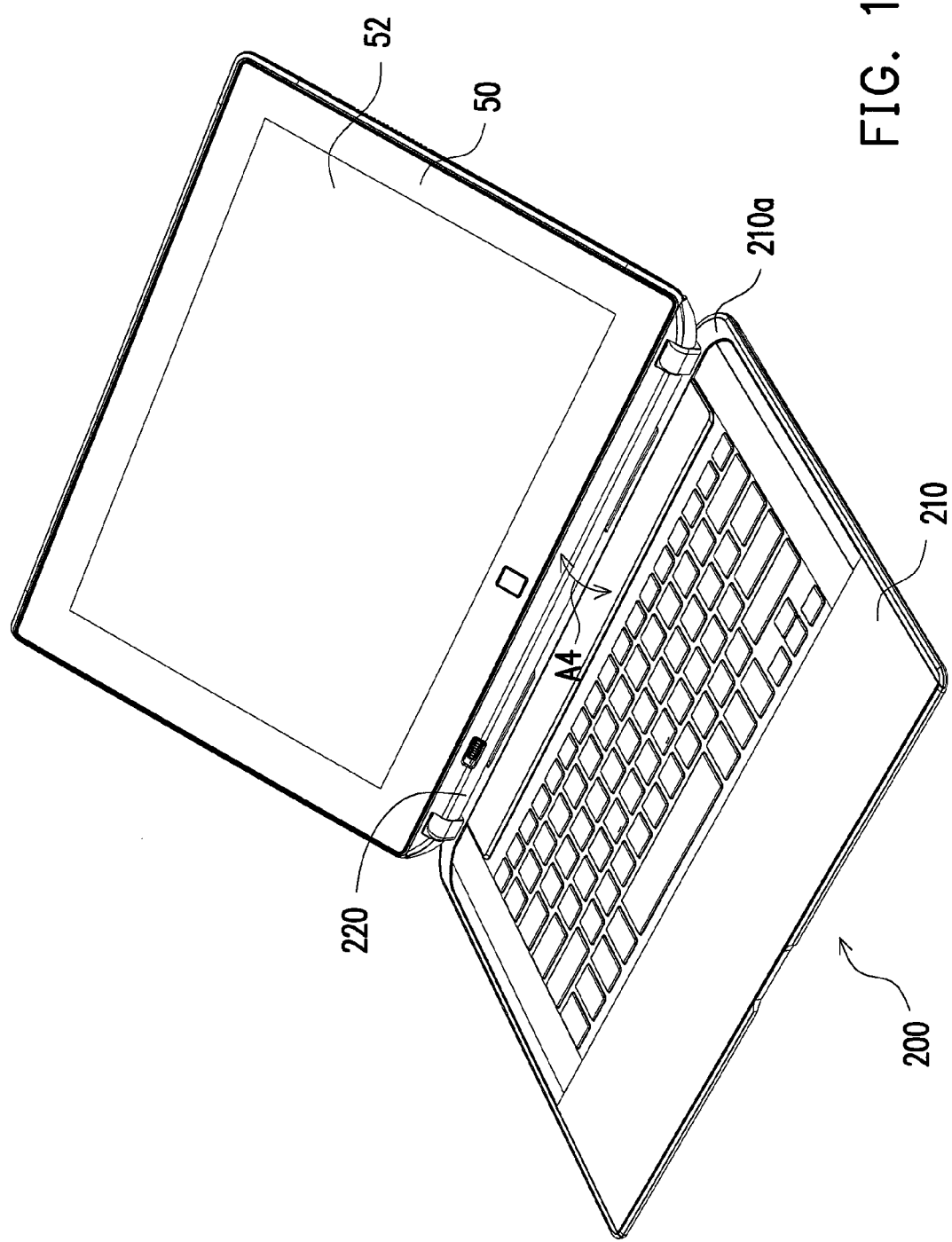

ELECTRONIC DEVICE

CROSS-REFERENCE TO RELATED APPLICATION

This application claims the priority benefits of U.S. provisional application Ser. No. 61/596,707, filed on Feb. 8, 2012. The entirety of the above-mentioned patent applications is hereby incorporated by reference herein and made a part of this specification.

BACKGROUND

1. Technical Field

The invention relates to an electronic device. Particularly, the invention relates to an electronic device capable of changing a center of gravity.

2. Related Art

Along with quick development of technology and advent of various portable devices, a user can use a portable device such as a notebook computer, a smart phone or a tablet personal computer (PC), etc. to process and transceive data at any time any where, and the portable devices have become indispensable products in people's daily life.

Taking the tablet PC as an example, when the user uses the tablet PC, the user generally holds the tablet PC through a single hand or places the tablet PC on a desk, and cannot operate the tablet PC in a more comfortable posture. In order to increase the comfort in use of the tablet PC, there is a plurality of peripheral devices of the tablet PC in the market for the user to purchase. For example, the tablet PC can be combined with a base having an input module, where the base can be used to support and fix the tablet PC, such that the user can perform operations in a more comfortable posture. In a design of some tablet PCs and the bases thereof, the tablet PC and the base can be rotated relative to each other, so as to adjust a tilt angle of the tablet PC. In such adjusting process, a center of gravity of the tablet PC may be too far away from the base and therefore causing of the whole structure to be unstable, which may cause inconvenience in use.

SUMMARY

The invention provides an electronic device, which is capable of avoiding unstable center of gravity of a whole structure.

The invention provides an electronic device including a base, a rotating element and a sliding element. The rotating element is pivoted to the base. The sliding element is slidably disposed on the base. When the rotating element is rotated relative to the base and an included angle between the rotating element and the base is greater than a specific angle, the sliding element slides from a first position to a second position relative to the base.

In an embodiment of the invention, the rotating element actuates the sliding element to slide.

In an embodiment of the invention, a center of gravity of the electronic device is changed along with a displacement of the sliding element.

In an embodiment of the invention, the specific angle is 90 degrees.

In an embodiment of the invention, a portable device is adapted to be installed to the rotating element. When the rotating element is rotated relative to the base and the included angle between the rotating element and the base is greater than the specific angle, the sliding element slides from the first position to the second position relative to the base, so as to change a center of gravity of the electronic device and the portable device.

In an embodiment of the invention, the rotating element is adjacent to a backend of the base. When the sliding element slides from the first position to the second position, the sliding element protrudes out from the backend.

In an embodiment of the invention, the electronic device further includes at least one functional element disposed on the base or the sliding element, wherein when the sliding element is located at the first position, the functional element is hidden. When the sliding element is located at the second position, the functional element is exposed.

In an embodiment of the invention, the functional element is disposed on the sliding element. When the sliding element is located at the first position, at least a part of the sliding element is accommodated in the base to hide the functional element. When the sliding element is located at the second position, at least a part of the sliding element protrudes out from the base to expose the functional element.

In an embodiment of the invention, the functional element is disposed on the base. The sliding element has a shielding portion. When the sliding element is located at the first position, the shielding portion shields the functional element. When the sliding element is located at the second position, the shielding portion moves away from the functional element.

In an embodiment of the invention, the sliding element is slidably disposed at a backend of the base. The functional element is disposed at a side edge of the base, and the shielding portion extends to the side edge from the backend.

In an embodiment of the invention, the functional element is a connection port, a speaker or a stylus.

In an embodiment of the invention, a number of the at least one functional element is plural. A part of the functional elements are disposed on the base, and a part of the functional elements are disposed on the sliding element. When the sliding element is located at the first position, the functional elements are hidden. When the sliding element is located at the second position, the functional elements are exposed.

In an embodiment of the invention, the electronic device further includes a linkage mechanism, which includes a first push block, a positioning element and a first elastic element. The first push block is slidably disposed on the base along a first direction. The positioning element is slidably disposed on the base along a second direction. The first elastic element is connected between the positioning element and the base, wherein when the included angle between the rotating element and the base is smaller than the specific angle, and the sliding element is located at the first position, the first elastic element pushes the positioning element to lean against the sliding element to position the sliding element. When the included angle between the rotating element and the base is greater than the specific angle, the rotating element pushes the first push block, and the first push block drives the positioning element to make the positioning element resisting an elastic force of the first elastic element to move away from the sliding element.

In an embodiment of the invention, the electronic device further includes a second elastic element connected between the sliding element and the base, wherein when the positioning element moves away from the sliding element, the sliding element slides to the second position through an elastic force of the second elastic element.

In an embodiment of the invention, the first push block has a first slope. The positioning element has a second slope. When the rotating element pushes the first push block to move along the first direction, the first slope pushes the second slope to drive the positioning element to move along the second direction.

In an embodiment of the invention, the first push block has a first slope. The positioning element has a second slope. The linkage mechanism further includes a second push block. The second push block has a third slope and a fourth slope, and is slidably disposed on the base along a third direction. When the rotating element pushes the first push block to move along the first direction, the first slope pushes the third slope to drive the second push block to move along the third direction, and the fourth slope pushes the second slope to drive the positioning element to move along the second direction.

In an embodiment of the invention, the sliding element has a positioning hole. The positioning element is adapted to be inserted in the positioning hole.

In an embodiment of the invention, when the sliding element is located at the second position, the positioning hole and the positioning element are mis-aligned. When the included angle between the rotating element and the base is smaller than the specific angle, the sliding element located at the second position is adapted to move to the first position under a stress, and drives the positioning hole to align with the positioning element, and the positioning element is inserted to the positioning hole through the elastic force of the elastic element.

In an embodiment of the invention, the rotating element has an actuation portion. When the included angle between the rotating element and the base is greater than the specific angle, the actuation portion pushes the first push block and drives the first push block to move along the first direction, and the first push block drives the positioning element to move along the second direction.

In an embodiment of the invention, the actuation portion is a bump.

According to the above descriptions, in the electronic device of the invention, when a user adjusts the angle of the rotating element to make the included angle between the rotating element and the base greater than the specific angle, the sliding element slides relative to the base to change the center of gravity of the electronic device. In this way, in case that the included angle between the rotating element and the base is relatively large, the center of gravity of the electronic device can be adjusted to a suitable position along with a displacement of the sliding element, so as to avoid unstable center of gravity of the whole structure and improve usage convenience of the electronic device.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 9A to FIG. 9C illustrate an operation flow of an electronic device according to another embodiment of the invention.

FIG. 10A to FIG. 10C are respectively schematic diagrams of a portable device combined with a base of FIG. 9A to FIG. 9C.

DETAILED DESCRIPTION OF DISCLOSED EMBODIMENTS

Figure 1A:
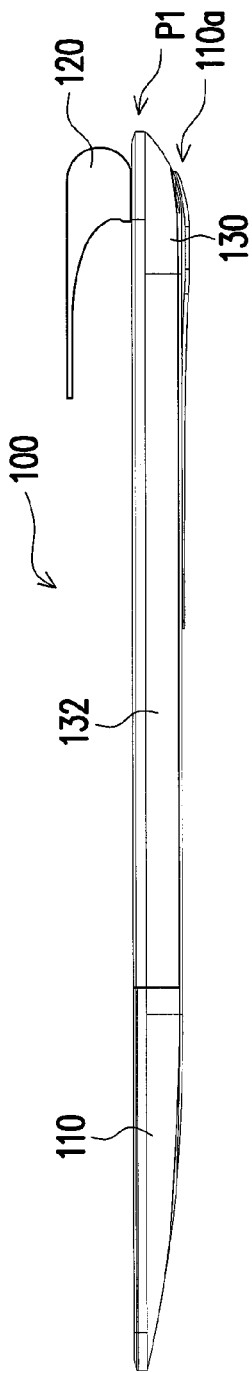
FIG. 1A to FIG. 1C illustrate an operation flow of the electronic device according to an embodiment of the invention.
Figure 1B:
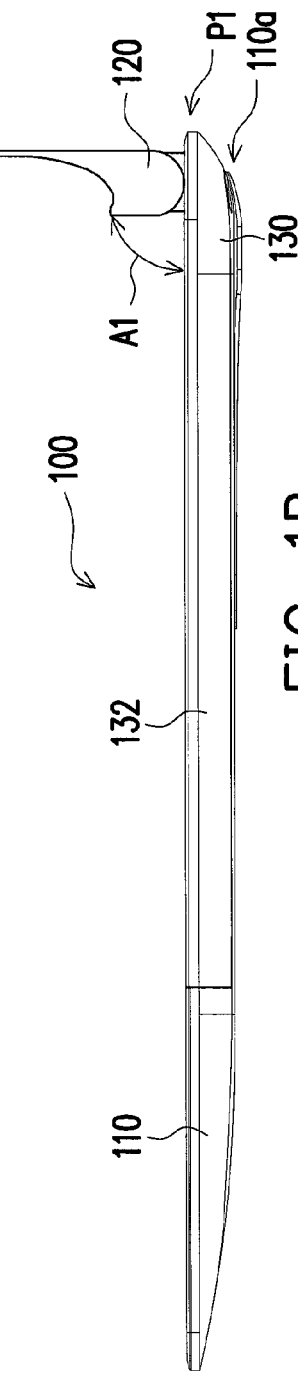
Figure 1C:
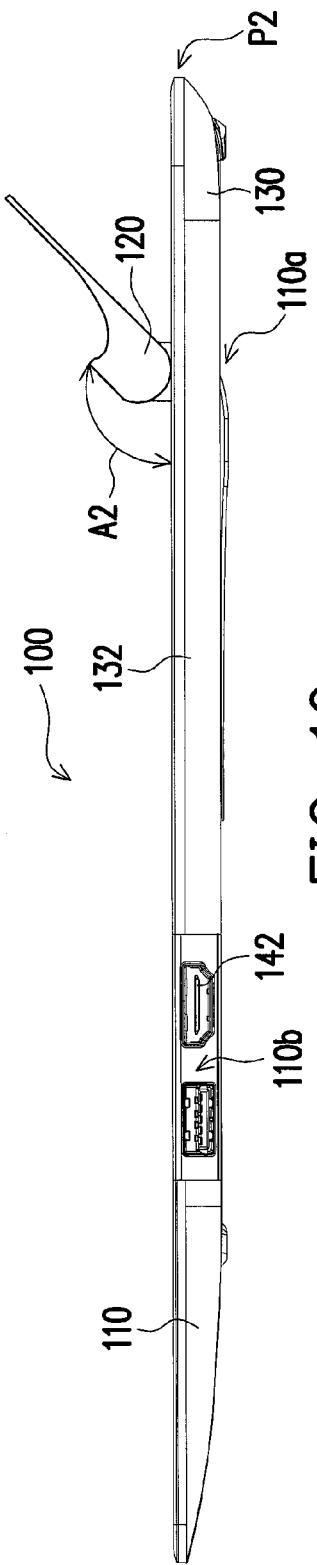

FIG. 1A to FIG. 1C illustrate an operation flow of the electronic device according to an embodiment of the invention. Referring to FIG. 1A to FIG. 1C, the electronic device 100 of the present embodiment includes a base 110, a rotating element 120 and a sliding element 130. The rotating element 120 is pivoted to the base 110. The sliding element 130 is slidably disposed on the base 110.

When the rotating element 120 is rotated relative to the base 110 from a state shown in FIG. 1A to a state shown in FIG. 1C, and an included angle A2 between the rotating element 120 and the base 110 is greater than an included angle A1 shown in FIG. 1B, the sliding element 130 slides from a first position P1 as that shown in FIG. 1A and FIG. 1B to a second position P2 as that shown in FIG. 1C relative to the base 110. The included angle A1 is, for example, 90 degrees, though the invention is not limited thereto, and in other embodiments, the included angle A1 can be set to other suitable angles.

In case of the aforementioned configuration, when a user adjusts an angle of the rotating element 120 to make the included angle between the rotating element 120 and the base 110 to be greater than a specific angle (i.e. the aforementioned included angle A1), the rotating element 120 drives the sliding element 130 to slide relative to the base 110, so as to change a center of gravity of the electronic device 100. In this way, in case that the included angle (for example, the included angle A2) between the rotating element 120 and the base 110 is relatively large, the center of gravity of the electronic device 100 can be adjusted to a suitable position along with a displacement of the sliding element 130, so as to avoid unstable center of gravity of the whole structure and improve usage convenience of the electronic device 100.

Figure 2A:
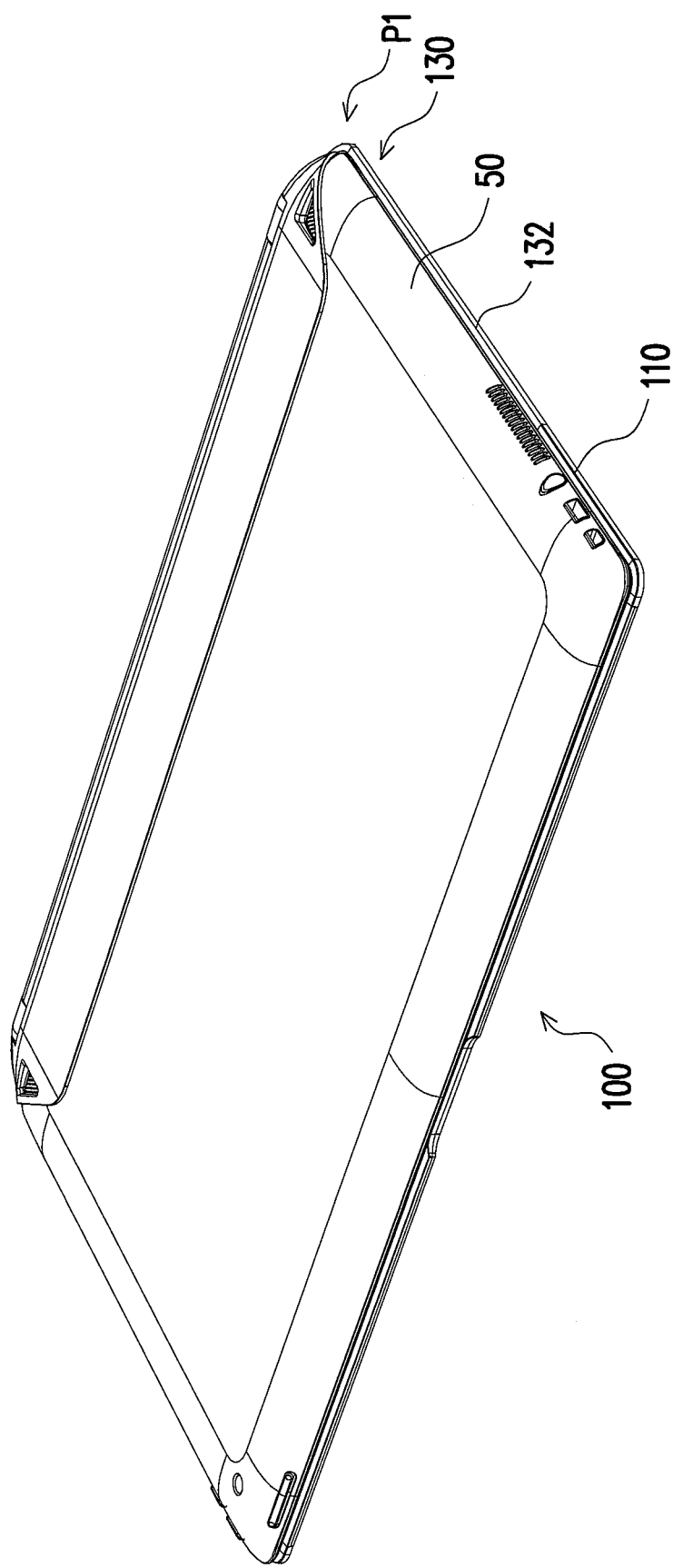
FIG. 2A to FIG. 2C are respectively schematic diagrams of a portable device combined with a base of FIG. 1A to FIG. 1C.
Figure 2B:
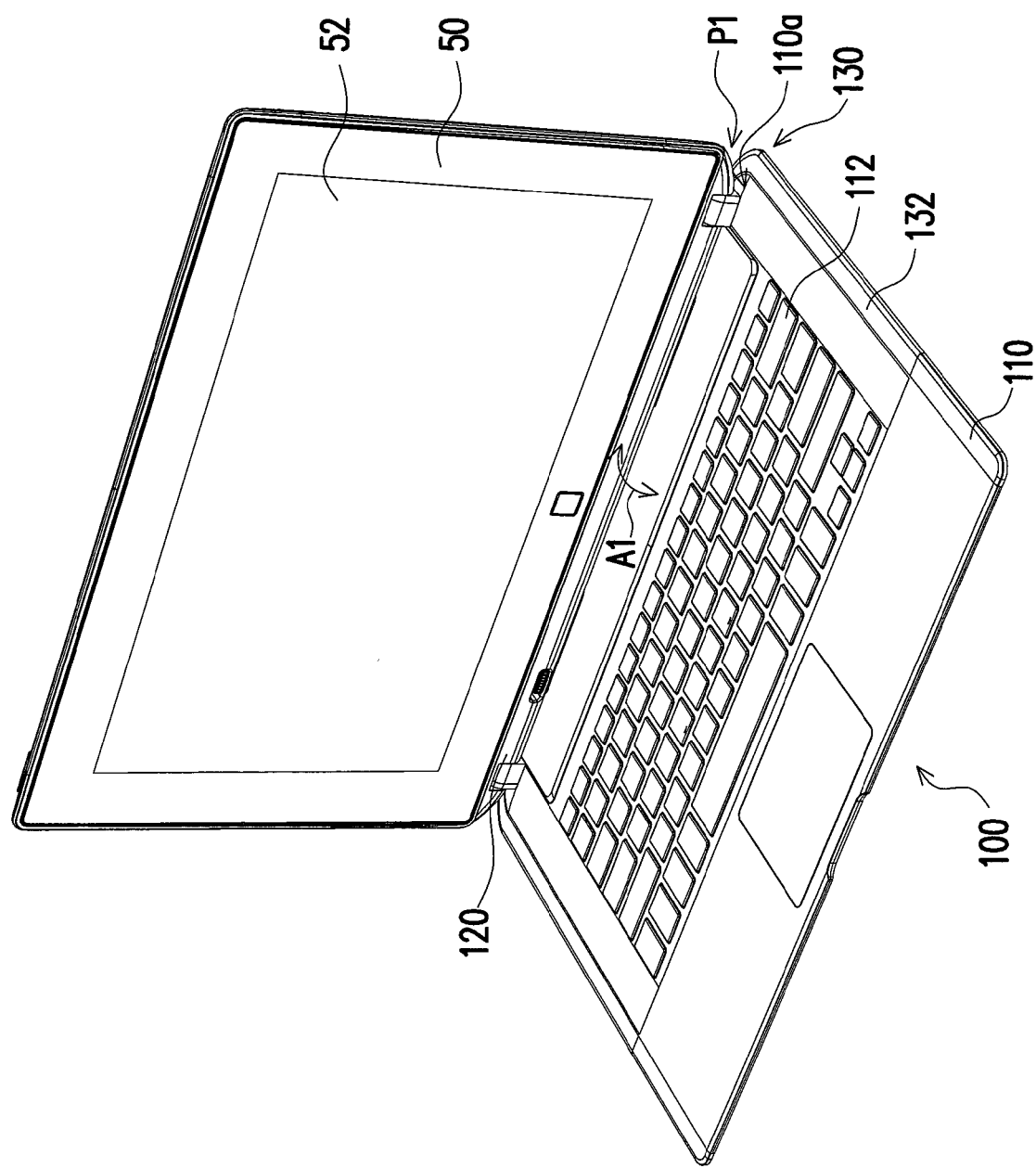
Figure 2C:
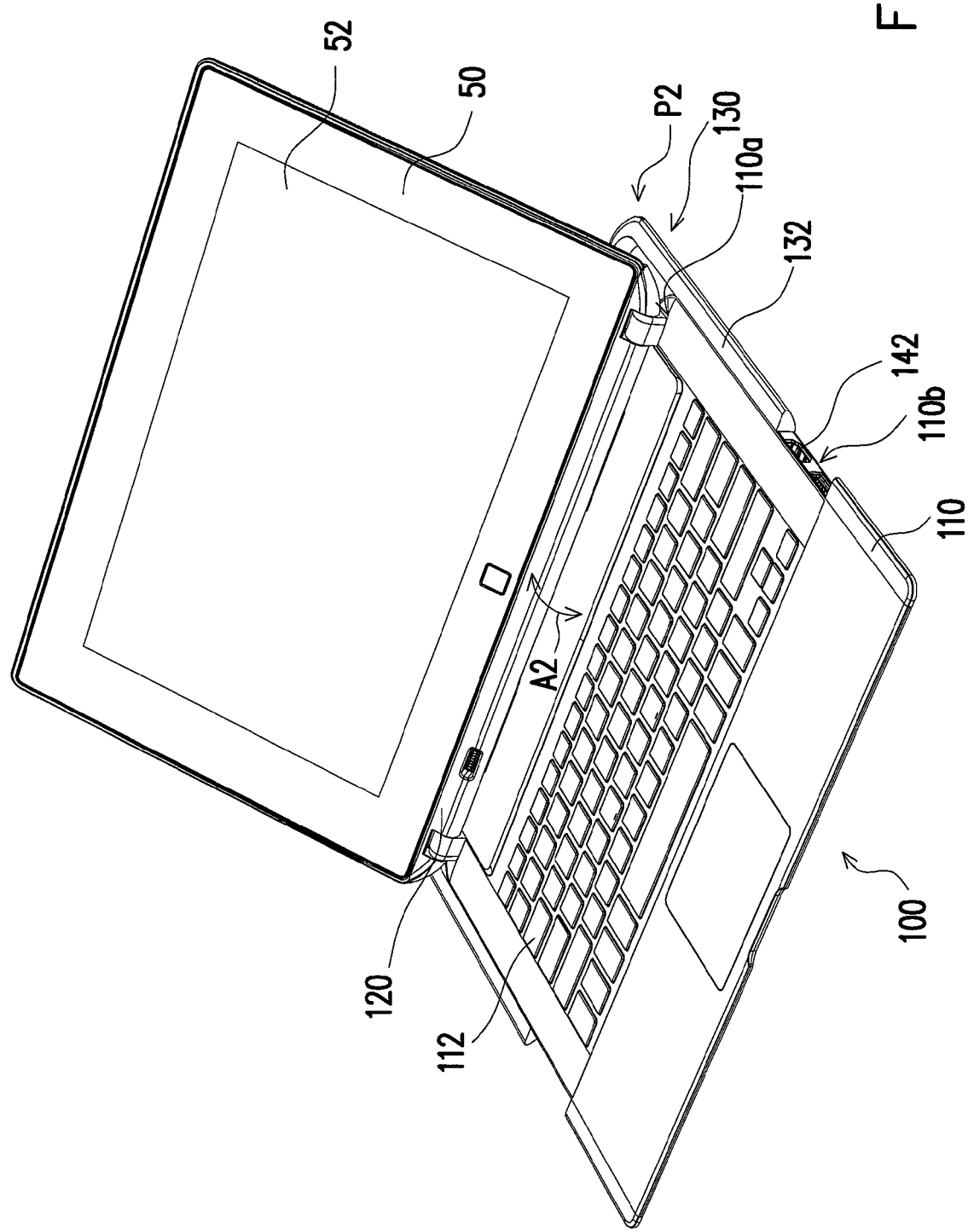

FIG. 2A to FIG. 2C are respectively schematic diagrams of a portable device combined with the base of FIG. 1A to FIG. 1C. Referring to FIG. 2A to FIG. 2C, in the present embodiment, a portable device 50 is detachably installed to the rotating element 120 and is electrically connected to the base 110, where the base 110 includes a keyboard 112, and the portable device 50 includes a display screen 52. The portable device 50 is, for example, a tablet personal computer (PC), which can be detached from the electronic device 100 for independent use, and can also be combined with or attach to the electronic device 100 so that the keyboard 112 of the electronic device 100 can be used to input instructions to the portable device 50, and the user can view images displayed by the display screen 52.

When the rotating element 120 is rotated relative to the base 110 from a state shown in FIG. 2A to a state shown in FIG. 2C, and the included angle A2 between the rotating element 120 and the base 110 is greater than the included angle A1 shown in FIG. 2B, the sliding element 130 slides from the first position P1 as that shown in FIG. 2A and FIG. 2B to the second position P2 as that shown in FIG. 2C relative to the base 110, and the center of gravity of the electronic device 100 and the portable device 50 is changed. The included angle A1 is, for example, 90 degrees, though the invention is not limited thereto, and in other embodiments, the included angle A1 can also be set to other suitable angles.

Further, the rotating element 120 is adjacent to a backend 110a of the base 110. When the sliding element 130 slides from the first position P1 as that shown in FIG. 1A, FIG. 1B, FIG. 2A and FIG. 2B to the second position P2 as that shown in FIG. 1C and FIG. 2C, the sliding element 130 protrudes out from the backend 110a of the base 110. Under such configuration, when the user adjusts the portable device 50 to make the included angle between the rotating element 120 and the base 110 to be greater than the specific angle (i.e. the aforementioned included angle A1), the sliding element 130 is driven by the rotating element 120 and slides relative to the base 110 to protrude out from the backend 110a of the base 110. In this way, in case that included angle (for example, the included angle A2) between the base 110 and the rotating element 120 or the portable device 50 combined with the rotating element 120 is relatively large, the center of gravity of the electronic device 100 and the portable device 50 can be adjusted to a suitable position along with the displacement of the sliding element 130, so as to avoid unstable center of gravity of the whole structure and improve usage convenience of the portable device 50 and the electronic device 100.

Figure 3:
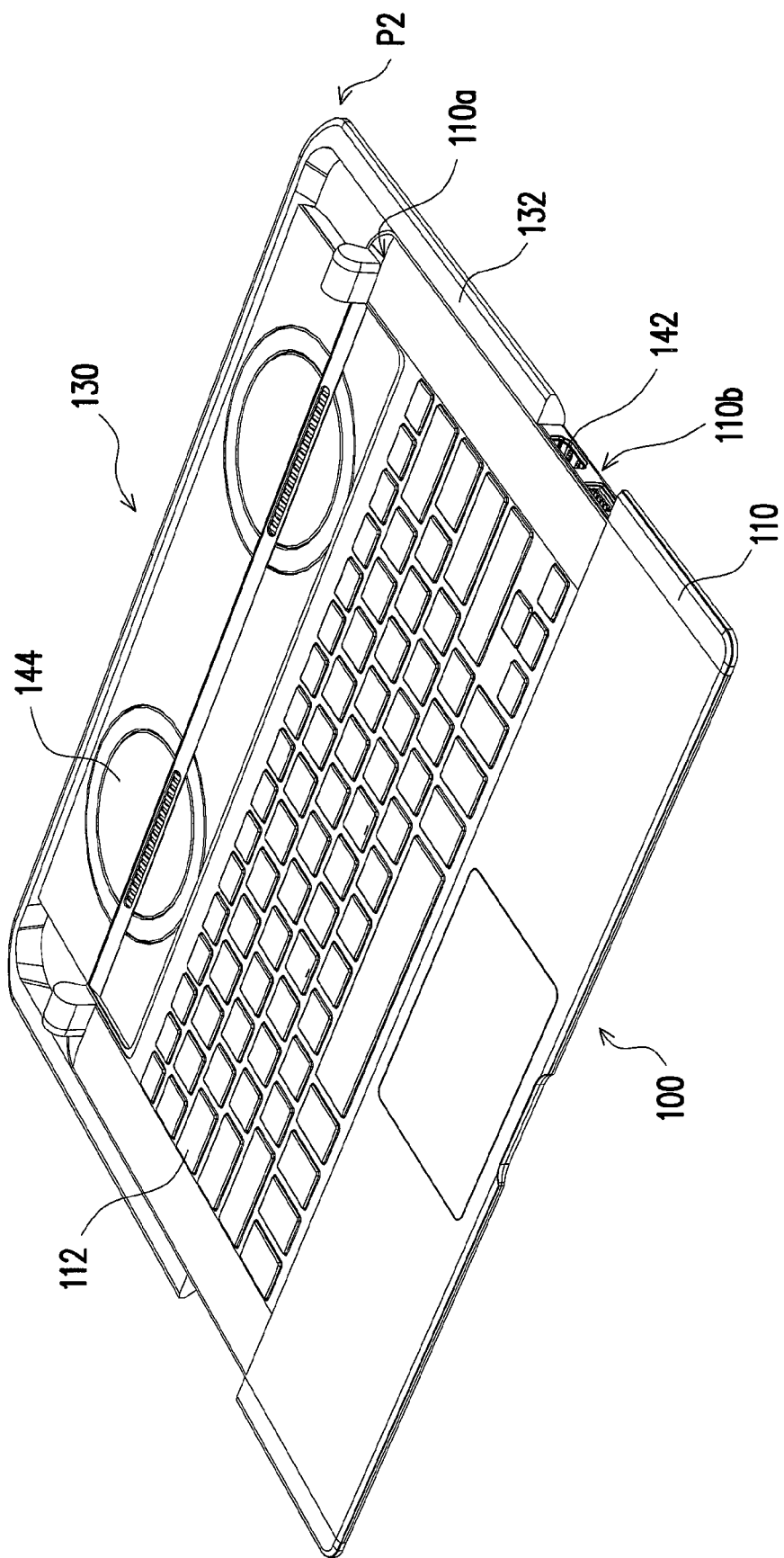
FIG. 3 is a schematic diagram of a part of components of an electronic device of FIG. 2C.

In an embodiment of the invention, the electronic device 100 further includes a functional element 142. The functional element 142 is disposed on the base 110. When the sliding element 130 is located at the first position P1 as that shown in FIG. 1A, FIG. 1B, FIG. 2A and FIG. 2B, the functional element 142 is hidden to avoid contamination and maintain a better appearance of the electronic device 100. When the sliding element 130 is located at the second position P2 as that shown in FIG. 1C and FIG. 2C, the functional element 142 is exposed for use. In the present embodiment, the functional element 142 is, for example, a connection port. FIG. 3 is a schematic diagram of a part of components of the electronic device of FIG. 2C. For clarity's sake, the rotating element 120 and the portable device 50 of FIG. 2C are not illustrated in FIG. 3. Referring to FIG. 2C and FIG. 3, the electronic device 100 further includes a functional element 144. The functional element 144 is, for example, a speaker and is disposed on the sliding element 130. When the sliding element 130 is located at the first position P1 as that shown in FIG. 1A, FIG. 1B, FIG. 2A and FIG. 2B, at least a part of the sliding element 130 is accommodated in the base 110 to hide the functional element 144. When the sliding element 130 is located at the second position P2 as that shown in FIG. 1C and FIG. 2C, at least a part of the sliding element 130 protrudes out from the base 110 to expose the functional element 144. Besides the connection port and the speaker, the aforementioned functional element 142 or 144 can also be a stylus or other functional element, which is not limited by the invention.

In the present embodiment, the connection port 142 is disposed at a side edge 110b of the base 110. The sliding element 130 is slidably disposed at the backend 110a of the base 110. The sliding element 130 has a shielding portion 132, and the shielding portion 132 extends to the side edge 110b of the base 110 from the backend 110a of the base 110. In this way, when the sliding element 130 is located at the first position P1, the shielding portion 132 of the sliding element 130 shields the connection port 142. When the sliding element 130 is located at the second position P2, the shielding portion 132 moves away from the connection portion 142 to expose the connection port 142 for connecting external devices.

Figure 4A:
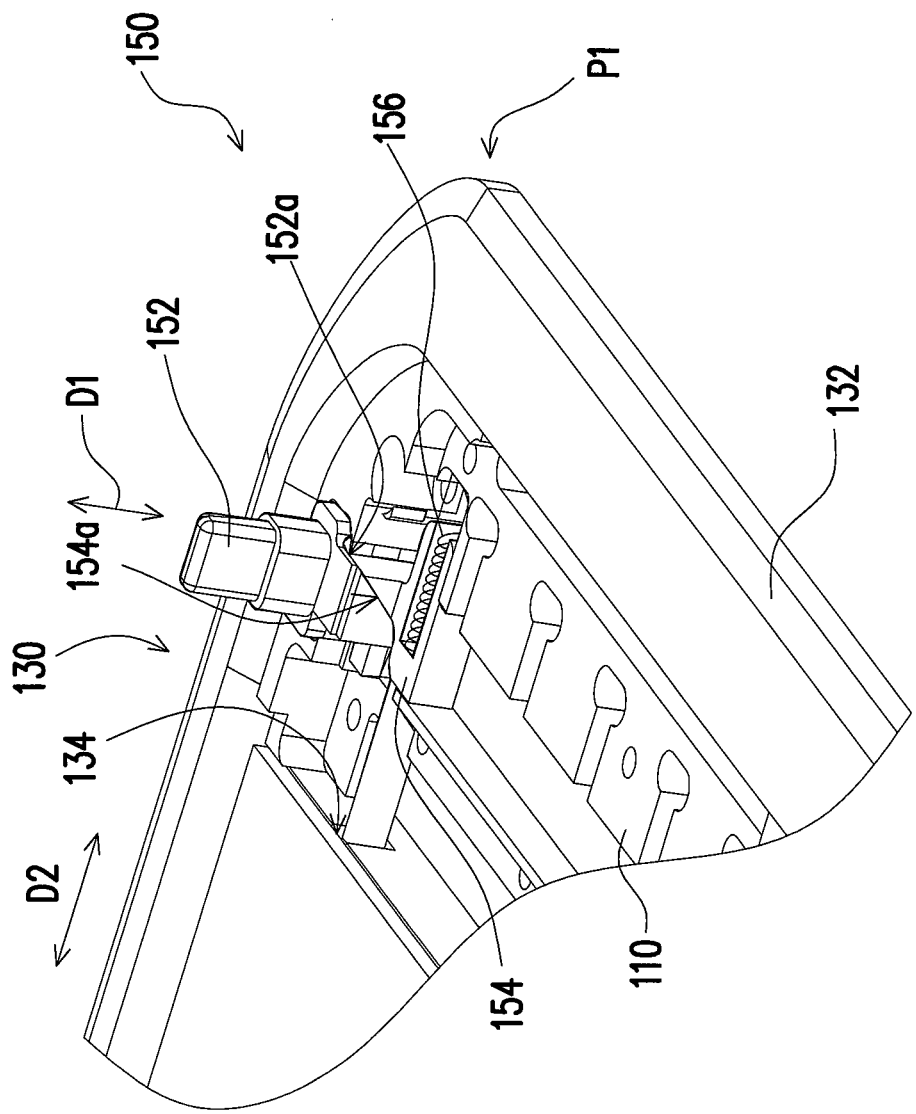
FIG. 4A to FIG. 4C illustrate an operation flow of a sliding element of FIG. 1A.
Figure 4B:
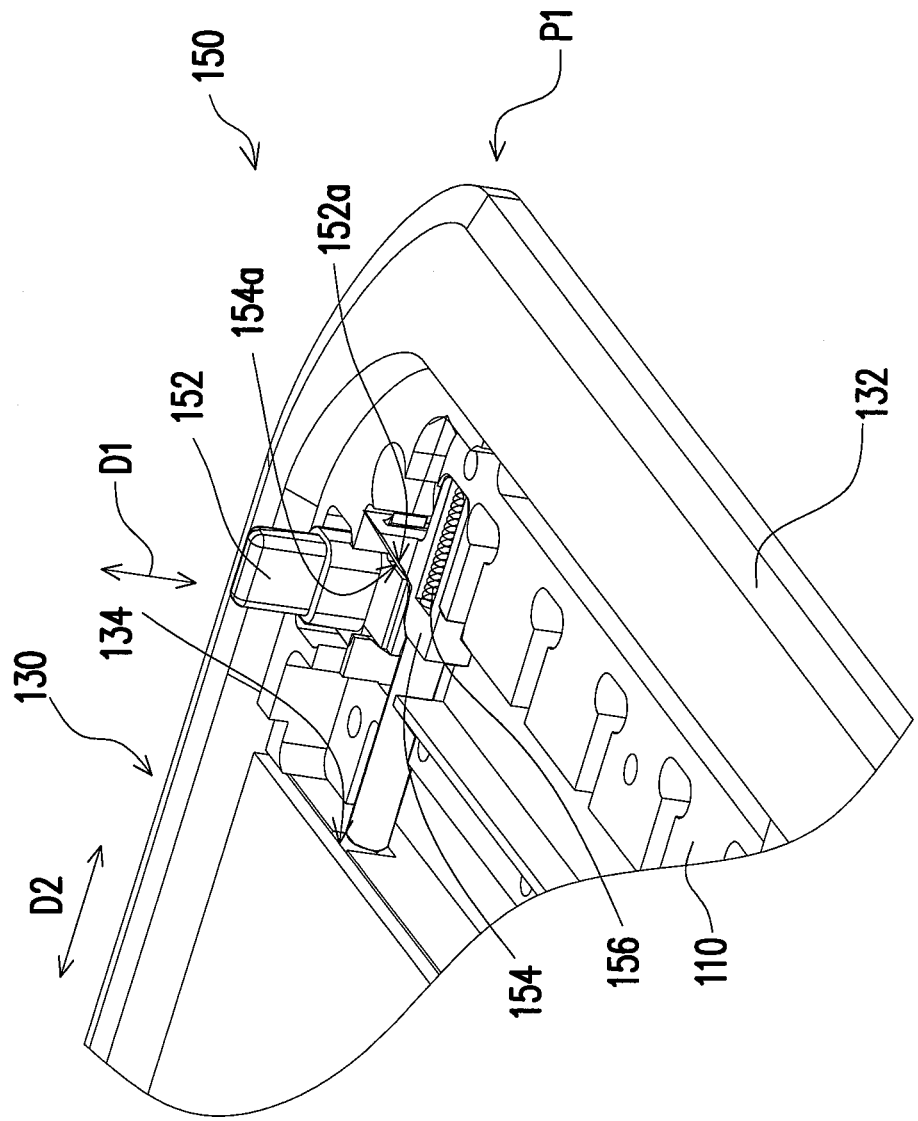
Figure 4C:
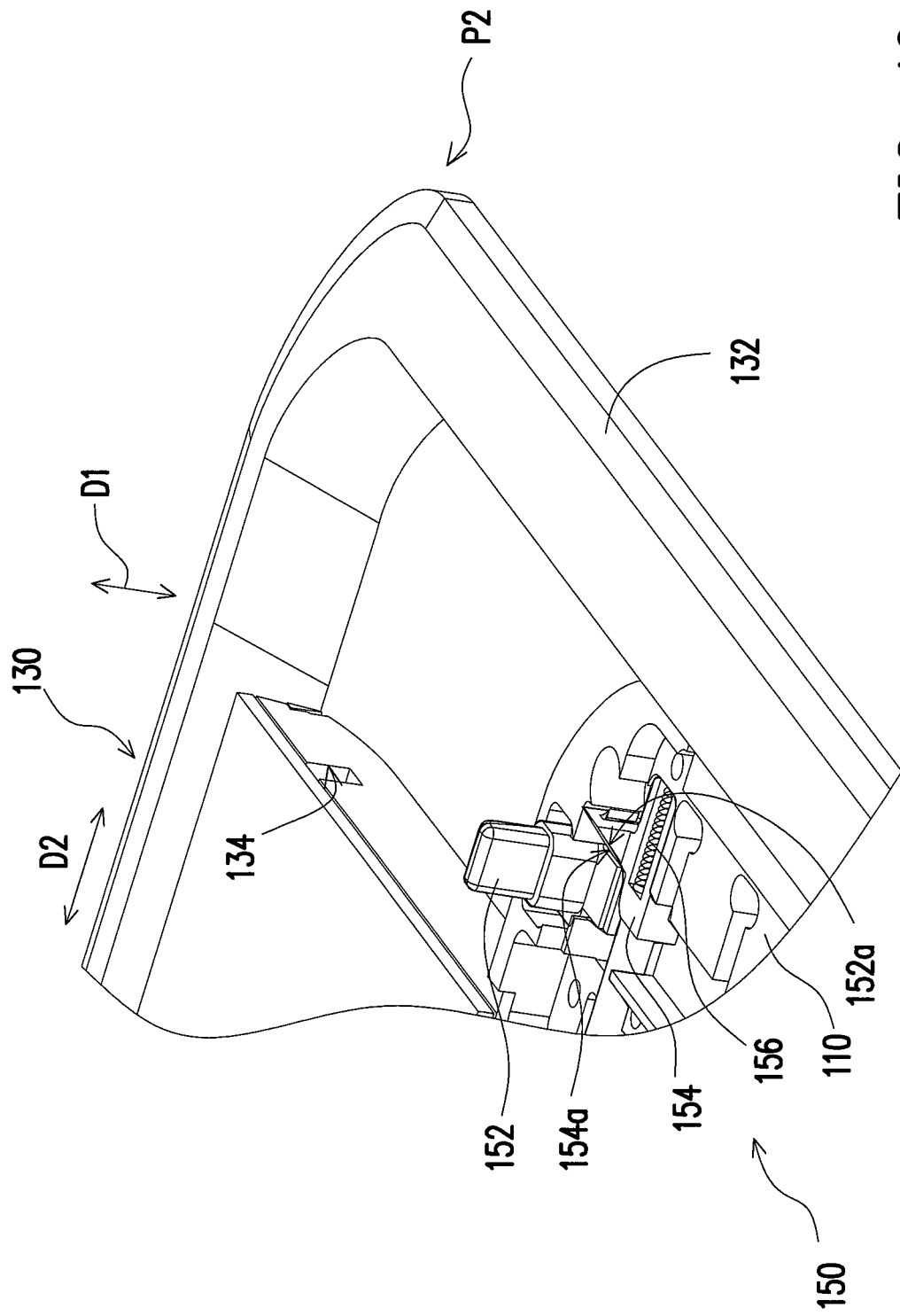

FIG. 4A to FIG. 4C illustrate an operation flow of the sliding element of FIG. 1A. Referring to FIG. 4A, the electronic device 100 of the present embodiment further includes a linkage mechanism 150. The linkage mechanism 150 includes a first push block 152, a positioning element 154 and a first elastic element 156. The first push block 152 is slidably disposed on the base 110 along a first direction D1. The positioning element 154 is slidably disposed on the base 110 along a second direction D2. The first elastic element 156 is, for example, a spring and is connected between the positioning element 154 and the base 110. When the included angle between the rotating element 120 and the base 110 is smaller than the included angle A1 shown in FIG. 1B, and the sliding element 130 is located at the first position P1 as that shown in FIG. 1B, the first elastic element 156 pushes the positioning element 154 to lean against the sliding element 130 to position the sliding element 130 as that shown in FIG. 4A. In the present embodiment, the sliding element 130 has a positioning hole 134. The positioning element 154 is adapted to be inserted in the positioning hole 134 to position the sliding element 130. In other embodiments, the sliding element can also be positioned to the base through other suitable structures, which is not limited by the invention.

Figure 5:
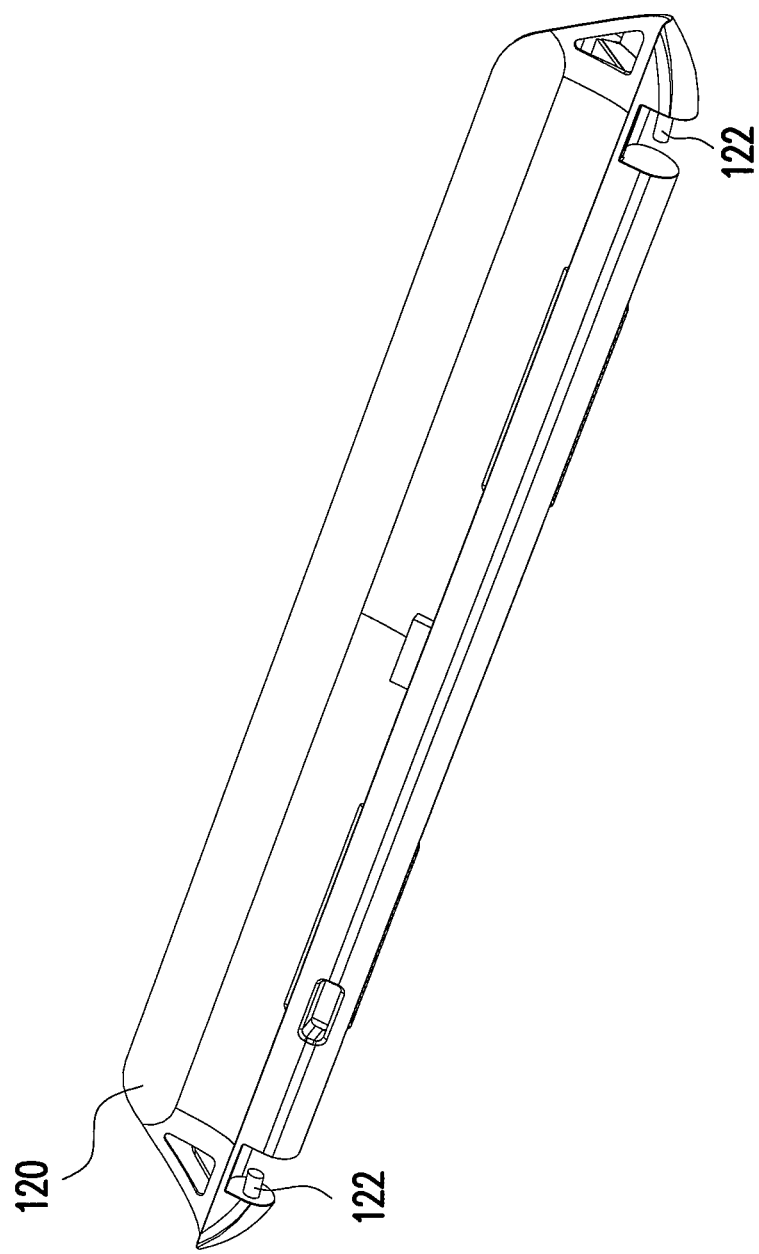
FIG. 5 is a three-dimensional view of the rotating element of FIG. 2A.
Figure 6A:
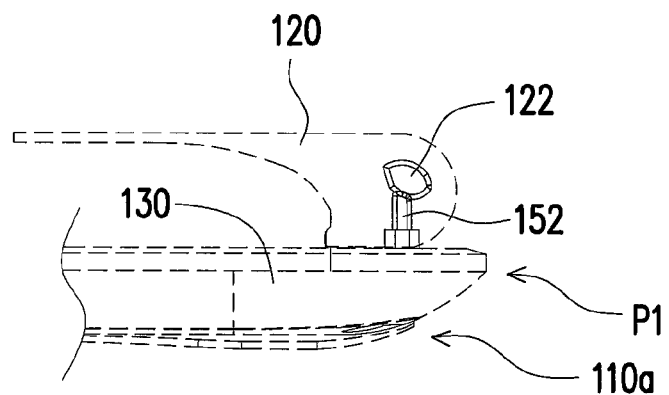
FIG. 6A to FIG. 6C are respectively schematic diagrams of a part of components of the electronic device of FIG. 1A to FIG. 1C.
Figure 6B:
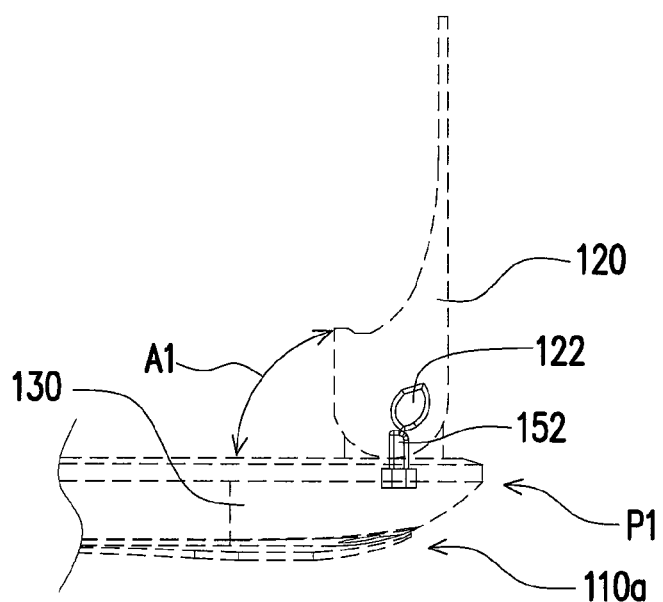
Figure 6C:
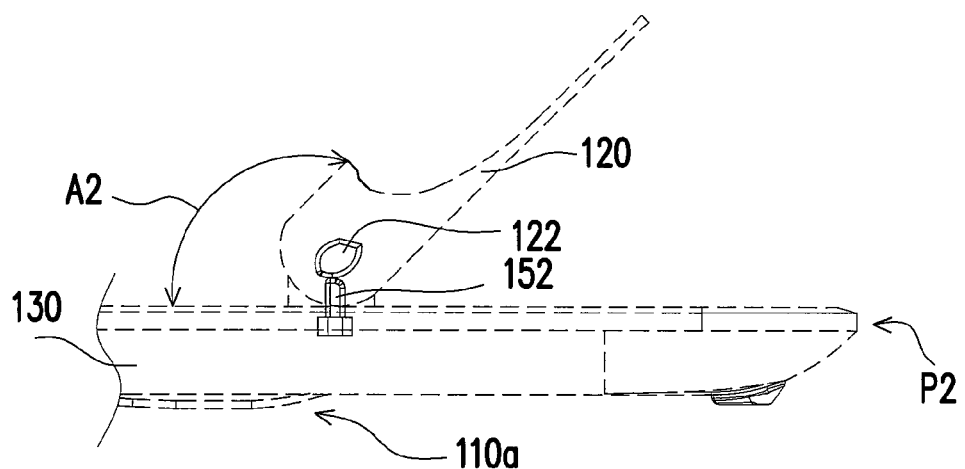

FIG. 5 is a three-dimensional view of the rotating element of FIG. 2A. FIG. 6A to FIG. 6C are respectively schematic diagrams of a part of components of the electronic device of FIG. 1A to FIG. 1C. Referring to FIG. 5 and FIG. 6A to FIG. 6C, the rotating element 120 of the present embodiment has an actuation portion 122 (which is a bump in the present embodiment, though the invention is not limited thereto), the first push block 152 has a first slope 152a, and the positioning element 154 has a second slope 154a. When the rotating element 120 is rotated relative to the base 110 from a state shown in FIG. 6A to a state shown in FIG. 6C to make the included angle A2 between the rotating element 120 and the base 110 to be greater than the included angle A1 shown in FIG. 6B, the actuation portion 122 of the rotating element 120 pushes the first push block 152 to move along the first direction D1 as that shown in FIG. 6C, and the first slope 152a of the first push block 152 pushes the second slope 154a of the positioning element 154 as that shown in FIG. 4B to drive the positioning element 154 to resist an elastic force of the first elastic element 156 to leave the positioning hole 134 of the sliding element 130 along the second direction D2. Now, the sliding element 130 is no longer positioned by the positioning element 154, and the sliding element 130 can slide from the first position P1 as that shown in FIG. 4B and FIG. 6B to the second position P2 as that shown in FIG. 4C and FIG. 6C relative to the base 110, so as to change the center of gravity of the electronic device 100.

Figure 7:
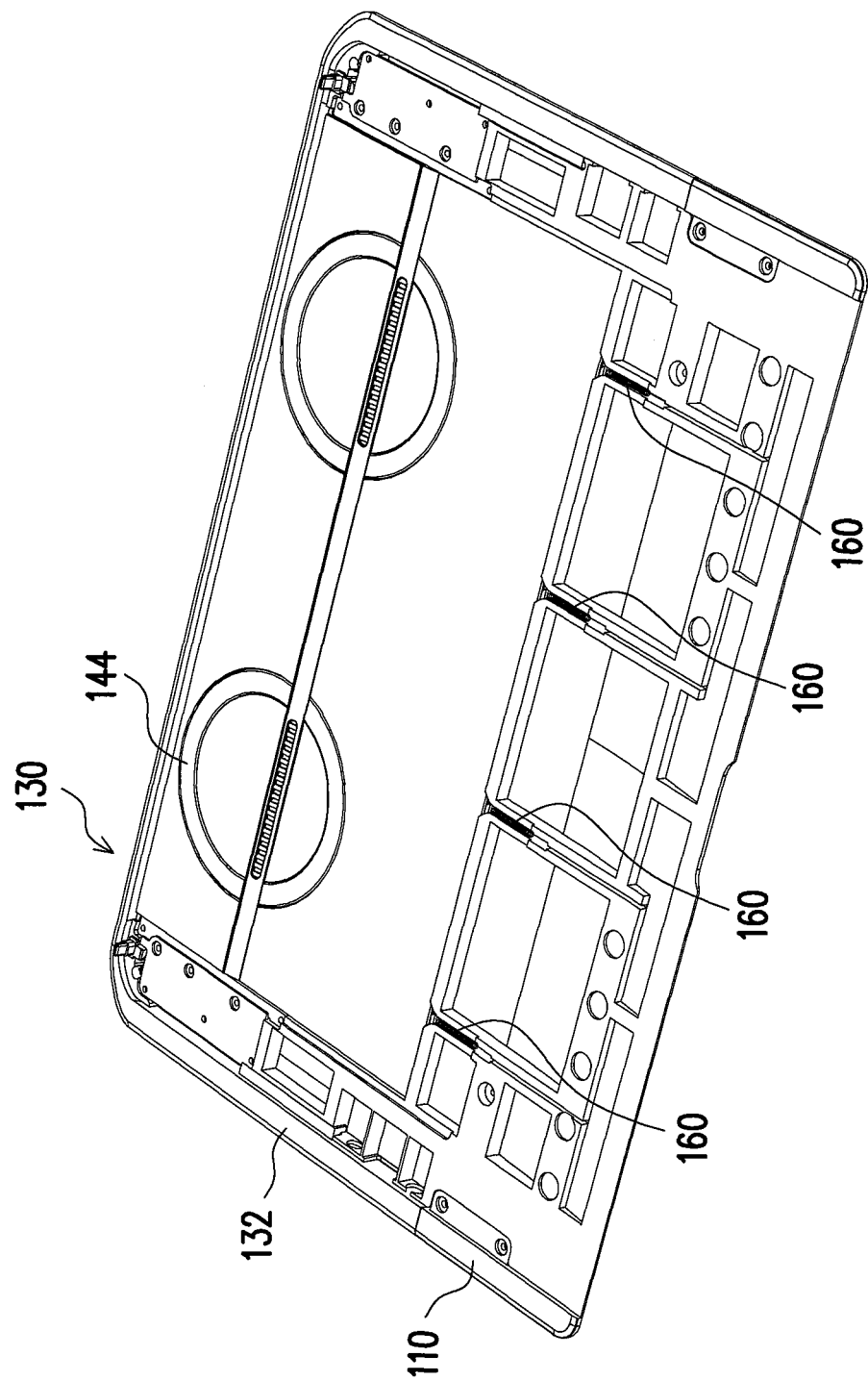
FIG. 7 is a three-dimensional view of a part of components of an electronic device of FIG. 2A.

FIG. 7 is a three-dimensional view of a part of components of the electronic device of FIG. 2A. Referring to FIG. 7, the electronic device 100 further includes at least one second elastic element 160 (four second elastic elements are illustrated). The second elastic elements 160 are, for example, springs and are connected between the sliding element 130 and the base 110. When the positioning element 154 moves away from the sliding element 130 as that shown in FIG. 4B, the sliding element 130 slides from the first position P1 shown in FIG. 4B to the second position P2 shown in FIG. 4C through elastic forces of the second elastic elements 160.

Figure 8:
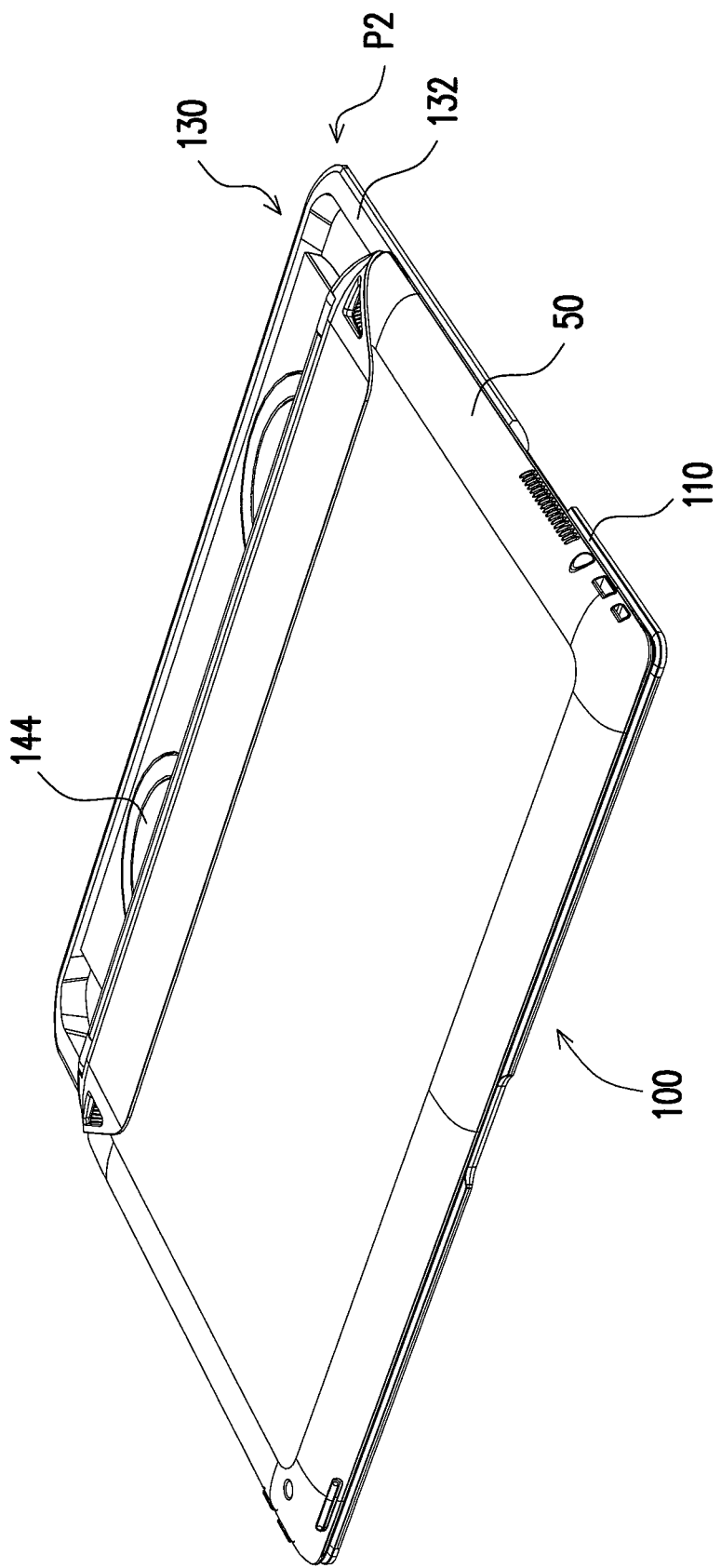
FIG. 8 is a schematic diagram of the portable device of FIG. 2C closed to the electronic device.

FIG. 8 is a schematic diagram of the portable device of FIG. 2C in a closed position to the electronic device. When the sliding element 130 is located at the second position P2 as that shown in FIG. 4C, the positioning hole 134 and the positioning element 154 are mis-aligned, and the positioning element 154 is blocked by the sliding element 130 and cannot move along the second direction D2. When the user wants to accommodate the sliding element 130 in the base 110, the user can close the rotating element 120 and the portable device 50 shown in FIG. 2C to the base 110 to a state as that shown in FIG. 8, so that the included angle between the rotating element 120 and the base 110 is smaller than the included angle A1 of FIG. 2B, and now the first push block 152 is no longer pushed by the actuation portion 122 of the rotating element 120. Then, the user can push the sliding element 130 located at the second position P2, and the sliding element 130 is pushed to resist the elastic force of the second elastic elements 160 and move to the position P1 shown in FIG. 4B, so as to drive the positioning hole 134 to align with the positioning element 154. Now, since the first push block 152 is no longer pushed by the actuation portion 122 of the rotating element 120, the positioning element 154 in the state as that shown in FIG. 4B can be recovered to the state of FIG. 4A through the elastic force of the first elastic element 156 to push the first push block 152 and insert in the positioning hole 134, so as to position the sliding element 130 to the first position P1.

Figure 10A:
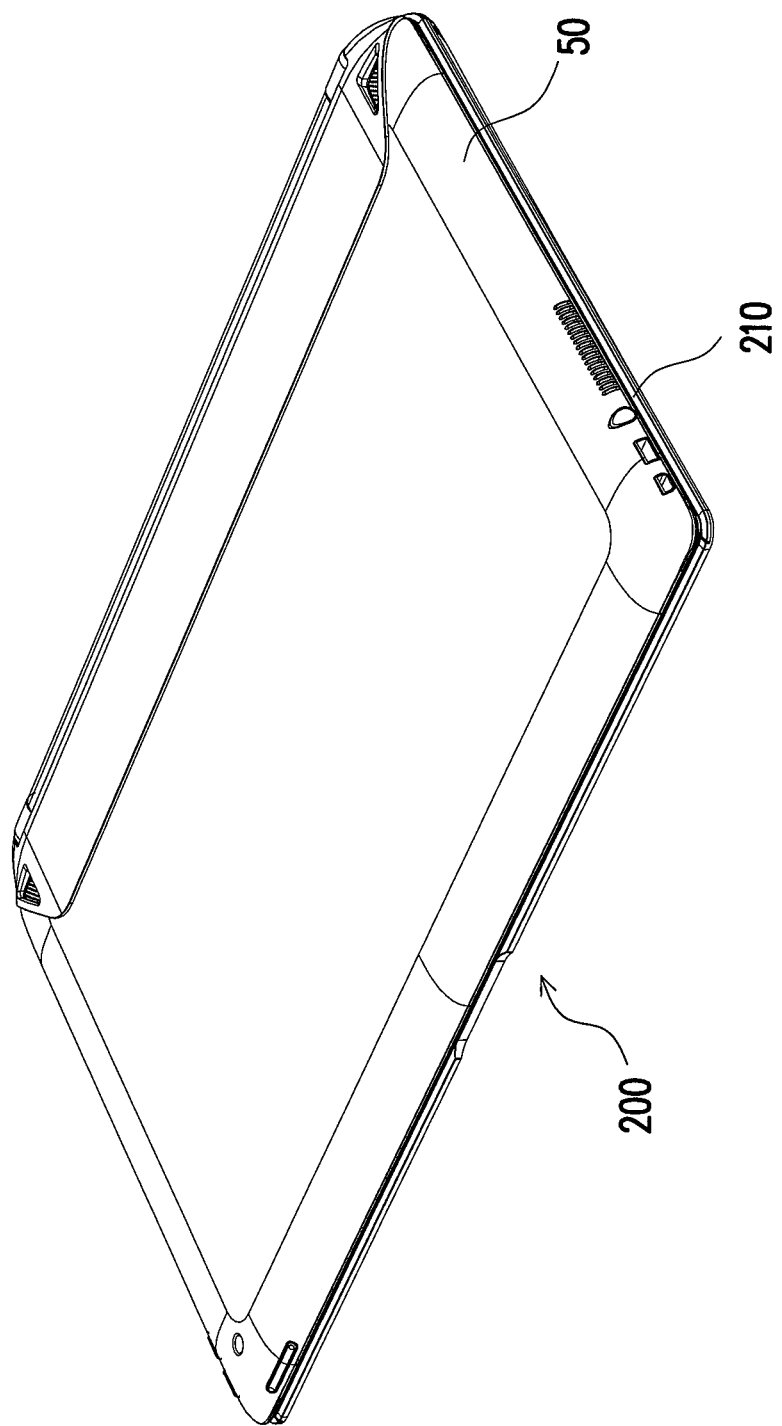
Figure 10B:
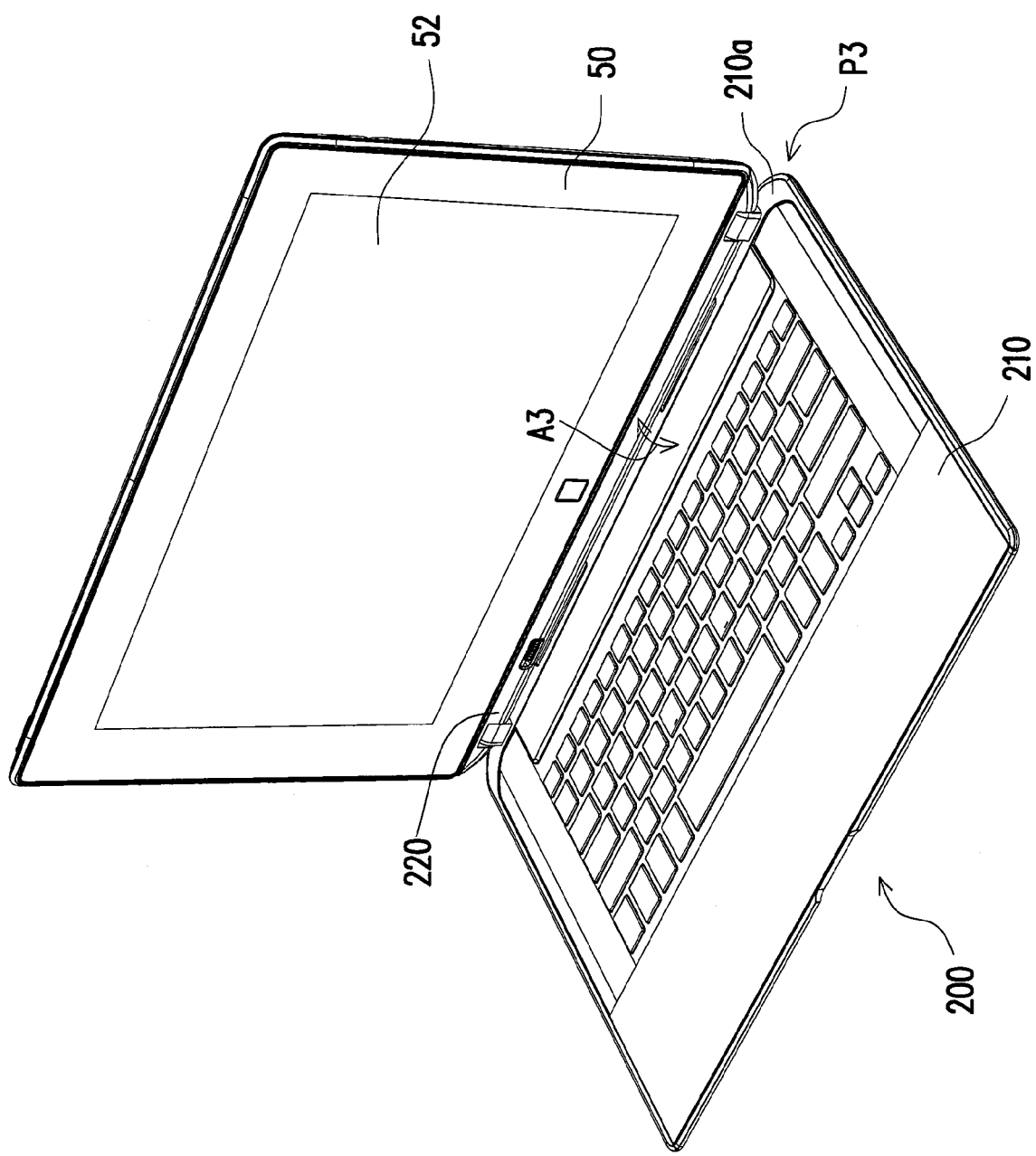

FIG. 9A to FIG. 9C illustrate an operation flow of an electronic device according to another embodiment of the invention. FIG. 10A to FIG. 10C are respectively schematic diagrams of a portable device combined with the base of FIG. 9A to FIG. 9C. Referring to FIG. 9A to FIG. 10C, in the electronic device 200 of the present embodiment, a configuration method of the portable device 50, a base 210 and a rotating element 220 is similar to that of the portable device 50, the base 110 and the rotating element 120 of FIG. 2C, and details thereof are not repeated. A difference between the electronic device 200 of the present embodiment and the electronic device 100 of FIG. 2C is that the sliding element 230 is disposed in the base 210.

When the user adjusts the angle of the rotating element 220 to make the included angle between the rotating element 220 and the base 210 to be greater than a specific angle (i.e. the aforementioned included angle A3, which is, for example, 90 degrees), the sliding element 230 is driven by the rotating element 220 and slides from a first position P3 shown in FIG. 9A and FIG. 9B to a second position P4 shown in FIG. 9C, and the sliding element 230 protrudes out from a backend 210a of the base 210 to change a center of gravity of the electronic device 200. In this way, in case that the included angle (for example, the included angle A4) between the rotating element 220 (and the portable device 50 combined with the rotating element 220) and the base 210 is relatively large, the center of gravity of the electronic device 200 is adjusted to a suitable position along with a displacement of the sliding element 230, so as to avoid unstable center of gravity of the whole structure and improve usage convenience of the electronic device 200.

Figure 11:
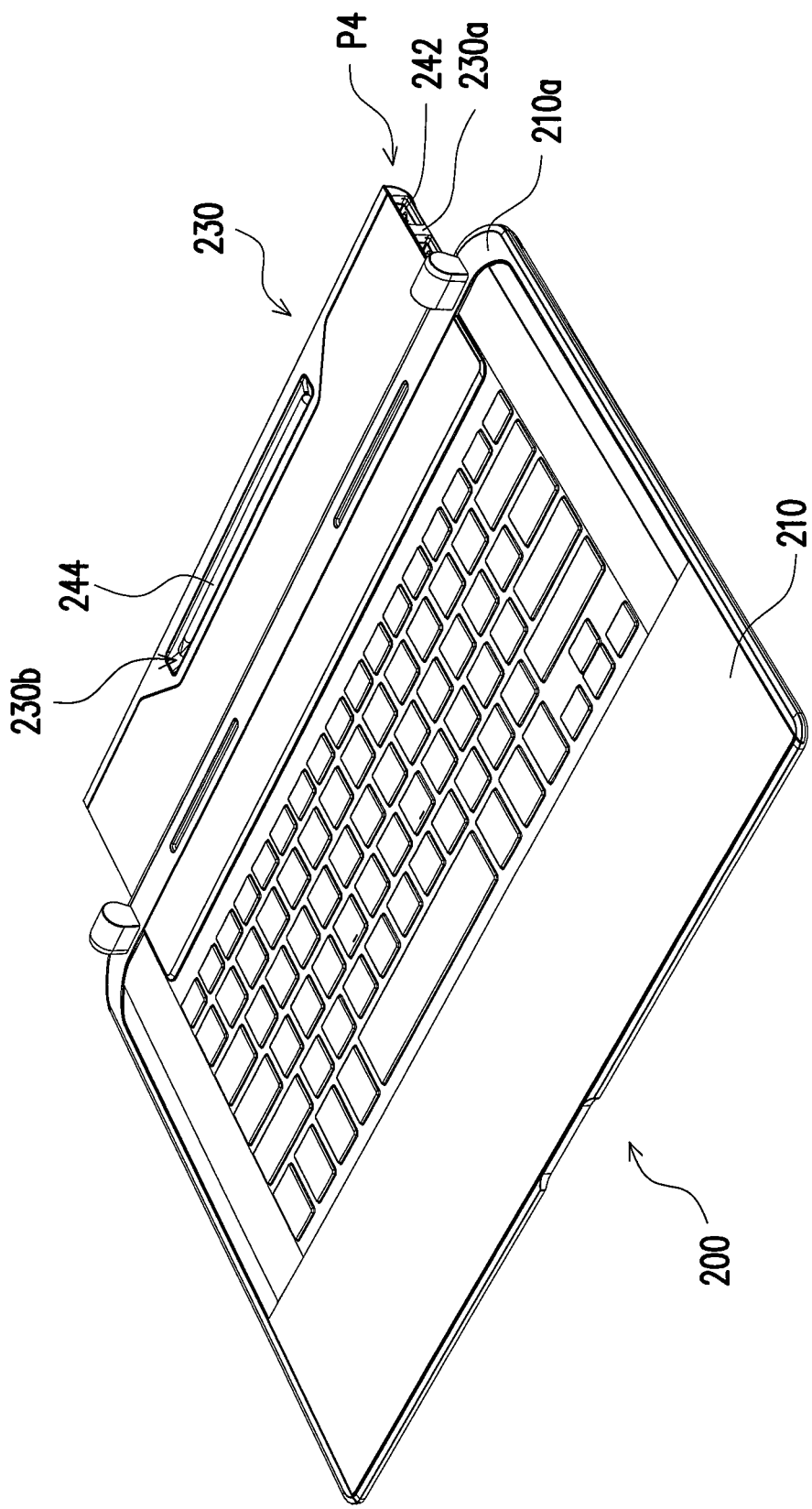
FIG. 11 is a schematic diagram of a part of components of the electronic device of FIG. 10C.

FIG. 11 is a schematic diagram of a part of components of the electronic device of FIG. 10C. For clarity's sake, the rotating element 220 and the portable device 50 of FIG. 10C are not illustrated in FIG. 11. In the present embodiment, the electronic device 200 further includes a functional element 242, which is disposed at a side edge 230a of the sliding element 230. When the sliding element 230 is located at the first position P3 as that shown in FIG. 9A and FIG. 9B, the functional element 242 is hidden to avoid contamination and maintain a better appearance of the electronic device 200. When the sliding element 230 is located at the second position P4 as that shown in FIG. 9C, the functional element 242 is exposed for use. In the present embodiment, the functional element 242 is, for example, a connection port. Moreover, the electronic device 200 further includes another functional element 244. The functional element 244 is, for example, a stylus and is disposed in the sliding element 230. When the sliding element 230 is located at the first position P3 as that shown in FIG. 9A and FIG. 9B, at least a part of the sliding element 230 is accommodated in the base 210 to hide the functional element 244. When the sliding element 230 is located at the second position P4 as that shown in FIG. 9C, at least a part of the sliding element 230 protrudes out from the base 210 to expose the functional element 244.

Besides the connection port and the stylus, the aforementioned functional element 242 or 244 can also be a speaker or other functional element, which is not limited by the invention.

In the present embodiment, the sliding element 230 has a containing slot 230b, and the functional element 244 is contained in the containing slot 230b of the sliding element 230. The sliding element 230 is slidably disposed at the backend 210a of the base 210. In this way, when the sliding element 230 is located at the first position P3, the sliding element 230 is accommodated in the base 210, and the base 210 covers the functional element 244. When the sliding element 230 is located at the second position P4, the sliding element 230 protrudes out from the base 210 to expose the functional element 244, so as to facilitate the user using the functional element 244.

Figure 12A:
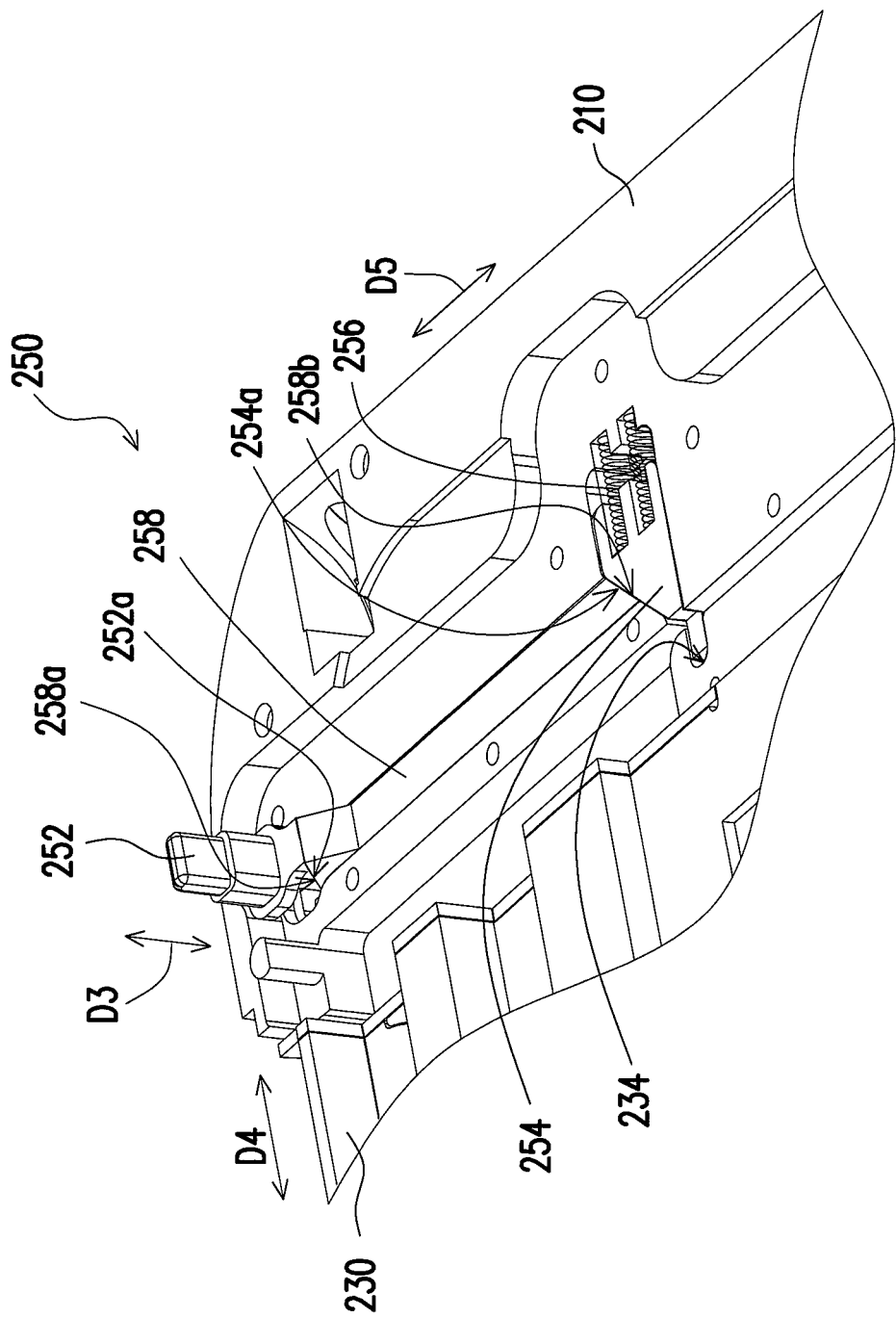
FIG. 12A to FIG. 12C illustrate an operation flow of a sliding element of FIG. 9A.
Figure 12B:
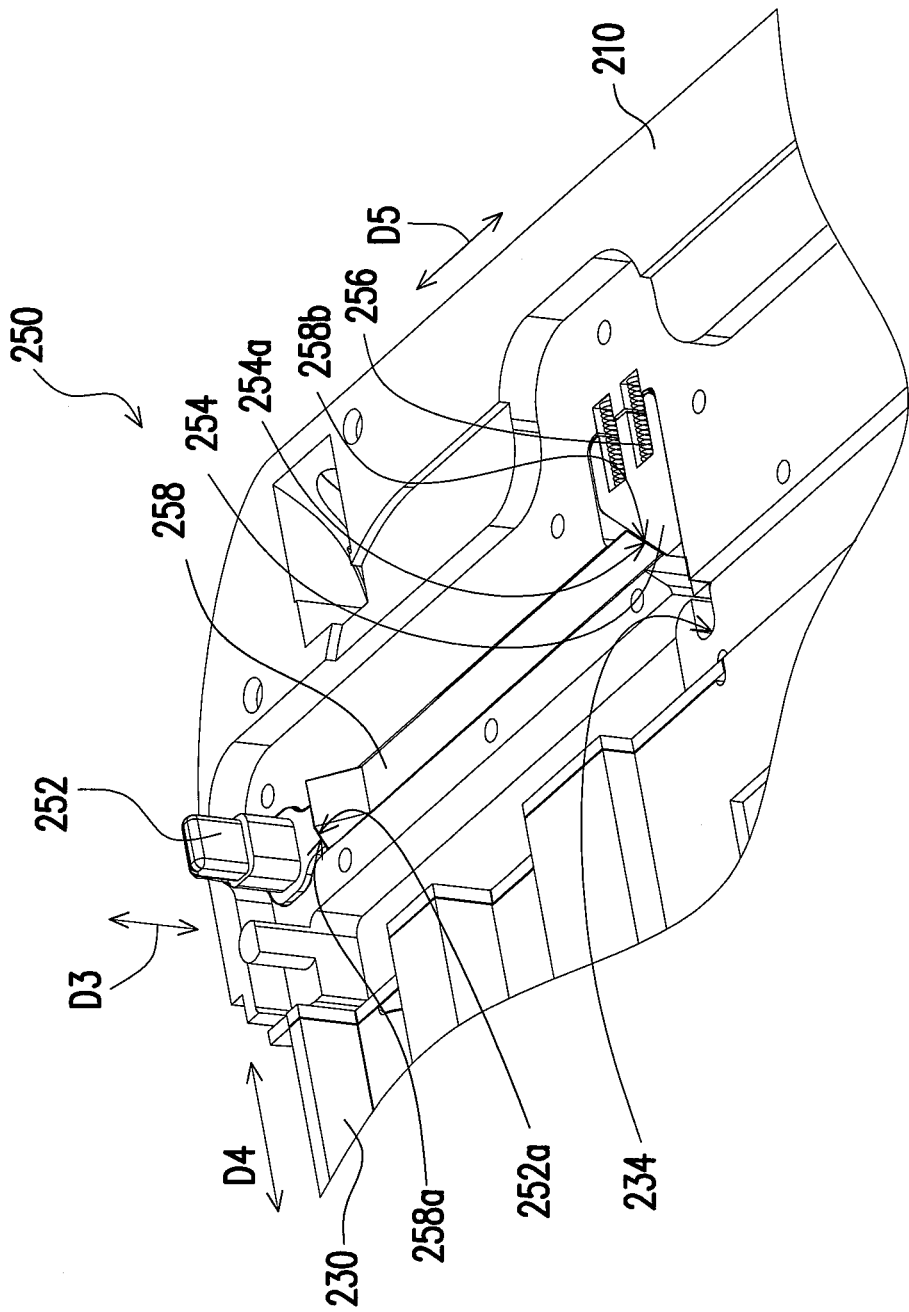
Figure 12C:
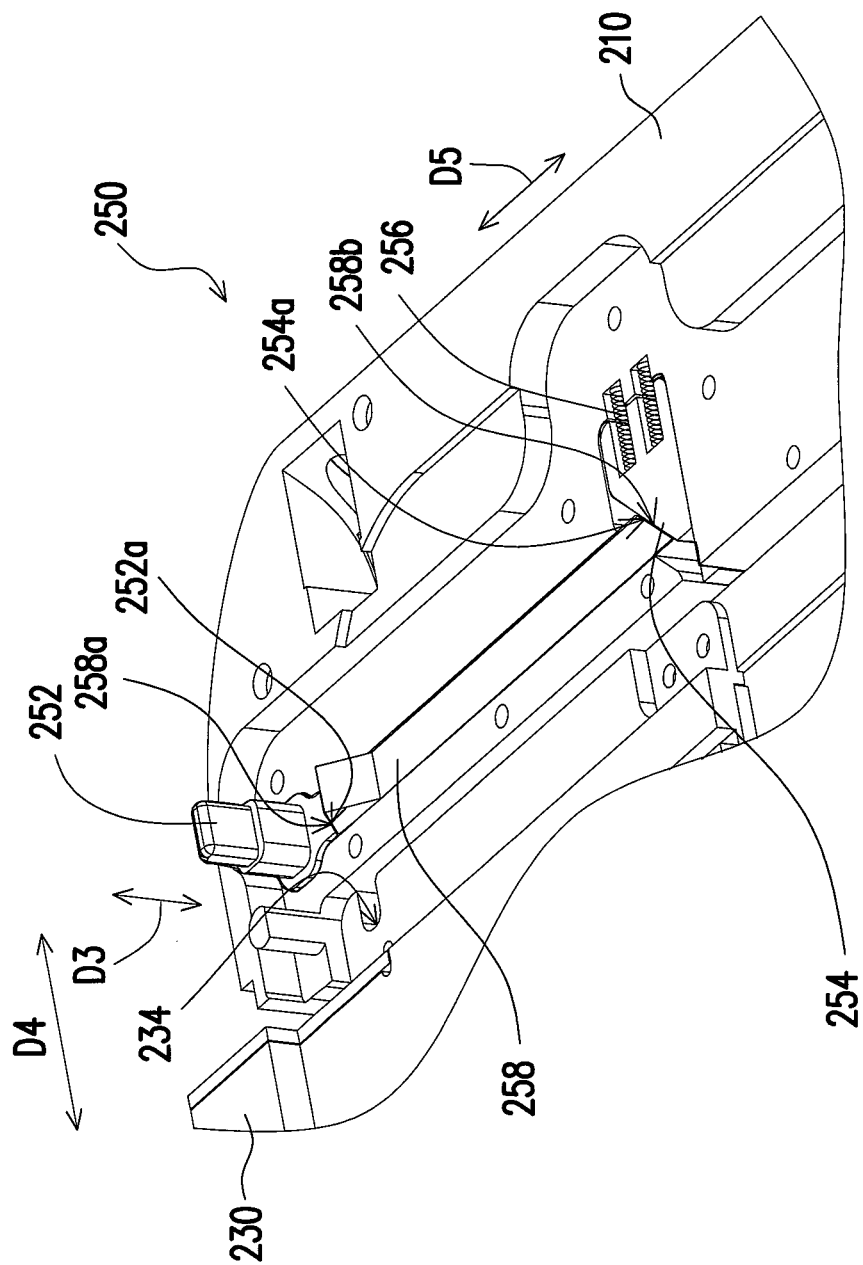

FIG. 12A to FIG. 12C illustrate an operation flow of the sliding element of FIG. 9A. Referring to FIG. 12A, the electronic device 200 of the present embodiment further includes a linkage mechanism 250. The linkage mechanism 250 includes a first push block 252, a positioning element 254, a first elastic element 256 and a second push block 258. The first push block 252 is slidably disposed on the base 210 along a first direction D3. The second push block 258 is slidably disposed on the base 210 along a third direction D5. The positioning element 254 is slidably disposed on the base 210 along a second direction D4. The first elastic element 256 is, for example, a spring and is connected between the positioning element 254 and the base 210. When the included angle between the rotating element 220 and the base 210 is smaller than the included angle A3 shown in FIG. 9B, and the sliding element 230 is located at the first position P3 as that shown in FIG. 9B, the first elastic element 256 pushes the positioning element 254 to lean against the sliding element 230 to position the sliding element 230 as that shown in FIG. 12A. In the present embodiment, the sliding element 230 has a positioning hole 234. The positioning element 254 is adapted to be inserted in the positioning hole 234 to position the sliding element 230. In other embodiments, the sliding element can also be positioned to the base through other suitable structures, which is not limited by the invention.

Figure 13A:
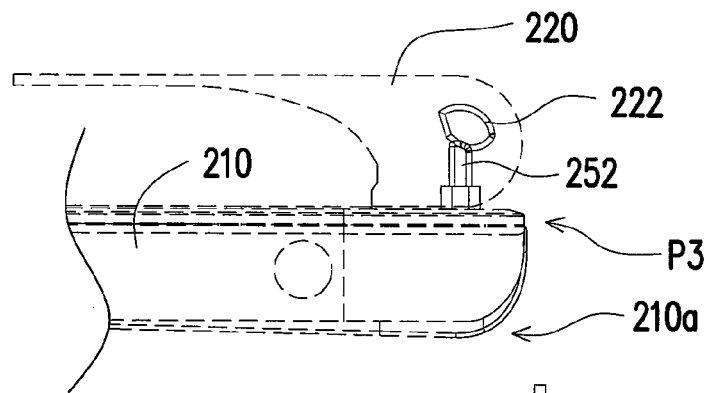
FIG. 13A to FIG. 13C are respectively schematic diagrams of a part of components of the electronic device of FIG. 9A to FIG. 9C.
Figure 13B:
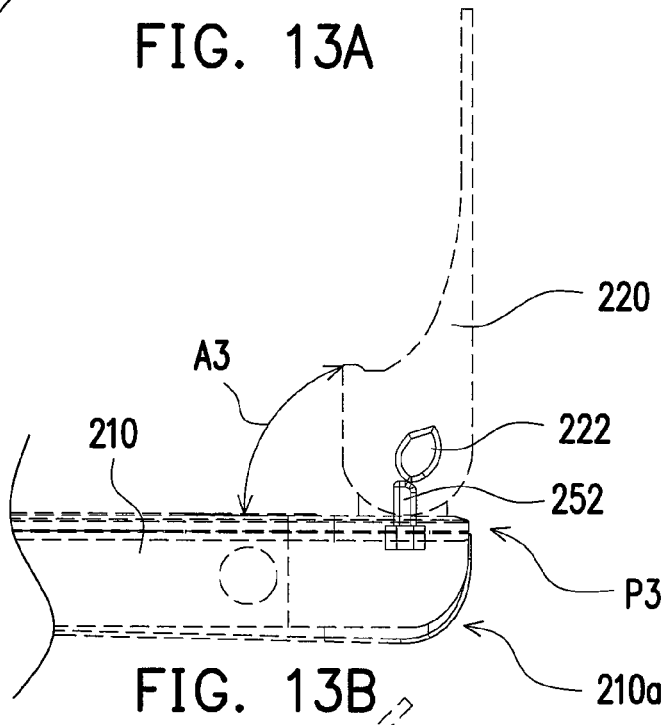
Figure 13C:
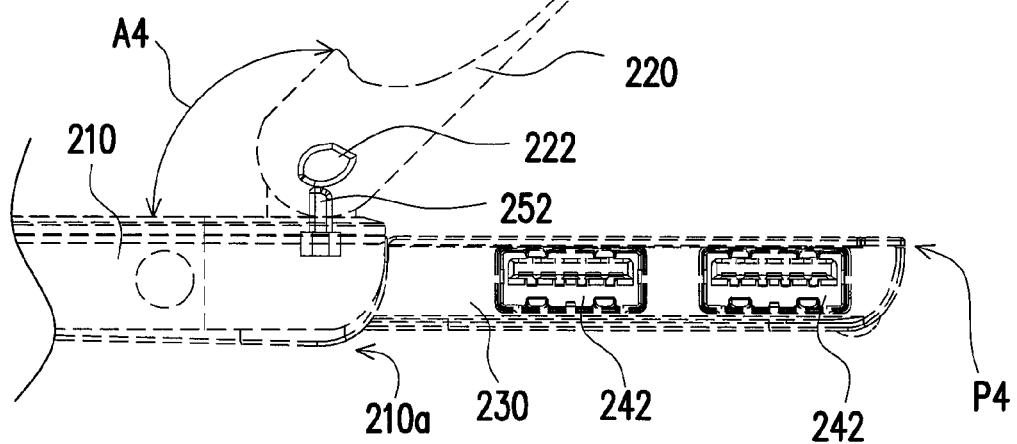

FIG. 13A to FIG. 13C are respectively schematic diagrams of a part of components of the electronic device of FIG. 9A to FIG. 9C. Referring to FIG. 13A to FIG. 13C, the rotating element 220 has an actuation portion 222 (which is a bump in the present embodiment, though the invention is not limited thereto), the first push block 252 has a first slope 252a, and the positioning element 254 has a second slope 254a. The second push block 258 has a third slope 258a and a fourth slope 258b. When the rotating element 220 is rotated relative to the base 210 from a state shown in FIG. 13A to a state shown in FIG. 13C to make the included angle A4 between the rotating element 220 and the base 210 to be greater than the included angle A3 shown in FIG. 13B, the actuation portion 222 (shown in FIG. 13C) of the rotating element 220 pushes the first push block 252 to move along the first direction D3 as that shown in FIG. 12B, and the first slope 252a of the first push block 252 pushes the third slope 258a of the second push block 258 as that shown in FIG. 12B to drive the second push block 258 to move along the third direction D5, in this way, the fourth slope 258b of the second push block 258 pushes the second slope 254a of the positioning element 254 as that shown in FIG. 12B to drive the positioning element 254 to resist an elastic force of the first elastic element 256 to leave the positioning hole 234 of the sliding element 230 along the second direction D4. Now, the sliding element 230 is no longer positioned by the positioning element 254, and the sliding element 230 can slide from the first position P3 as that shown in FIG. 12B and FIG. 13B to the second position P2 as that shown in FIG. 12C and FIG. 12C relative to the base 210, so as to change the center of gravity of the electronic device 200.

Figure 14:
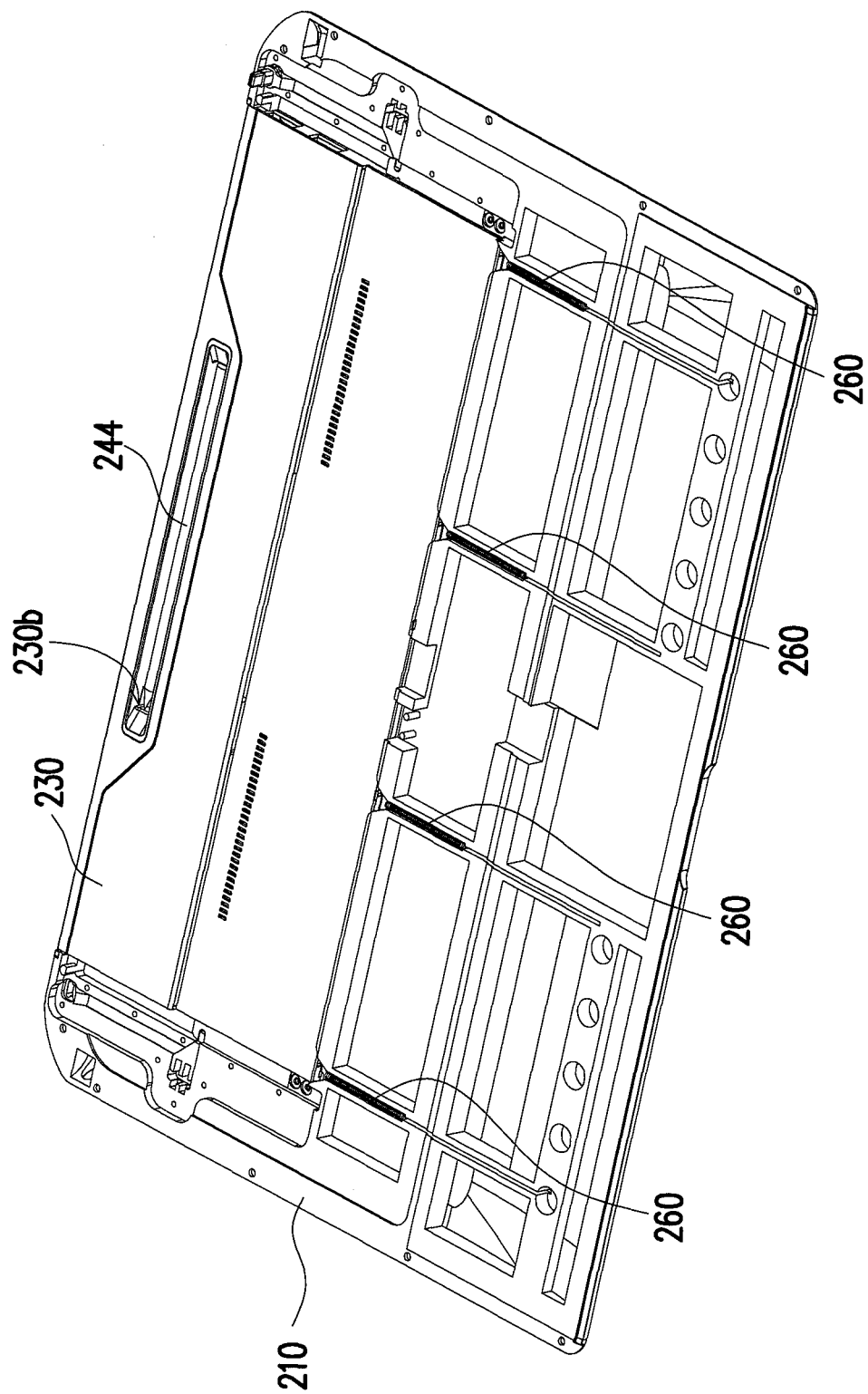
FIG. 14 is a three-dimensional view of a part of components of the electronic device of FIG. 10A.

FIG. 14 is a three-dimensional view of a part of components of the electronic device of FIG. 10A. Referring to FIG. 14, the electronic device 200 further includes at least one second elastic element 260 (four second elastic elements are illustrated). The second elastic elements 260 are, for example, springs and are connected between the sliding element 230 and the base 210. When the positioning element 254 moves away from the sliding element 230 as that shown in FIG. 12B, the sliding element 230 slides from the first position P3 shown in FIG. 12B to the second position P4 shown in FIG. 12C through elastic forces of the second elastic elements 260.

Figure 15:
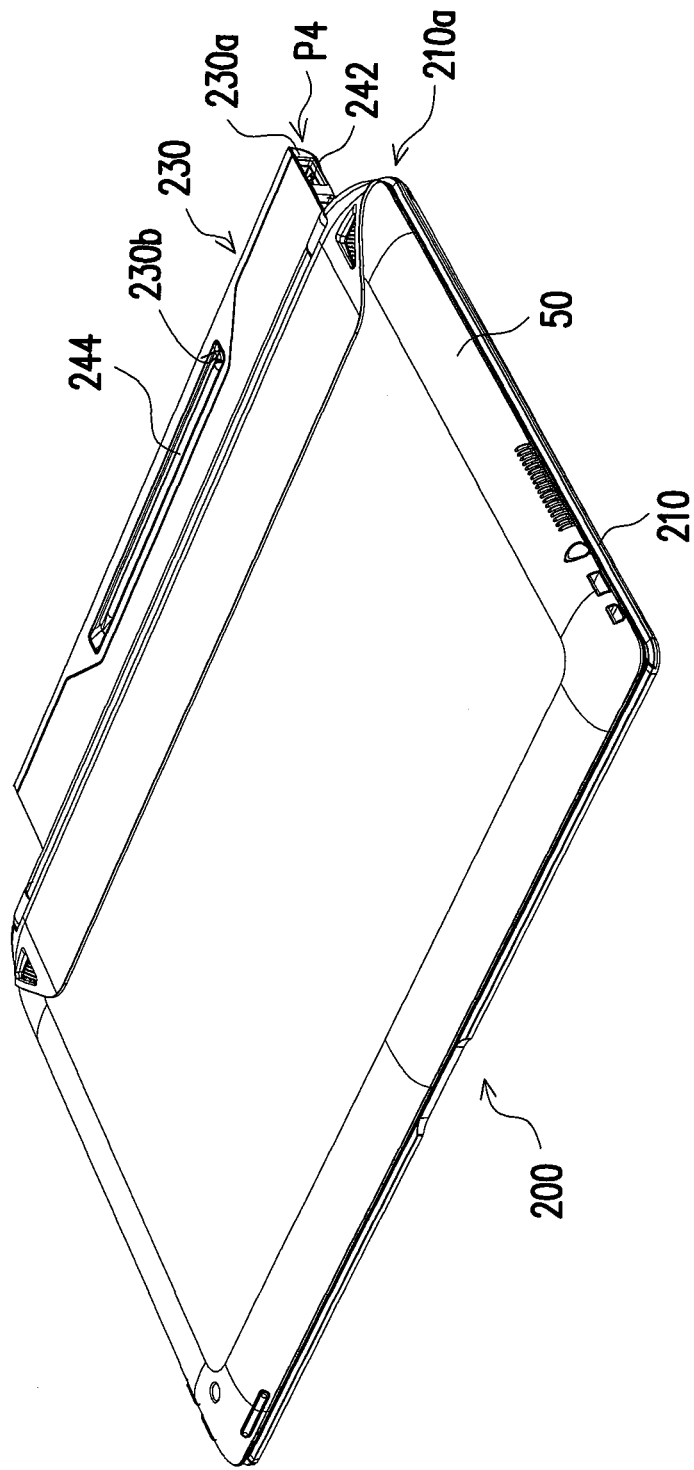
FIG. 15 is a schematic diagram of the portable device of FIG. 10C closed to the electronic device.

FIG. 15 is a schematic diagram of the portable device of FIG. 10C in a closed position to the electronic device. When the sliding element 230 is located at the second position P4 as that shown in FIG. 12C, the positioning hole 234 and the positioning element 254 are mis-aligned, and the positioning element 254 is blocked by the sliding element 230 and cannot move along the second direction D4. When the user wants to accommodate the sliding element 230 to the base 210, the user can close the rotating element 220 and the portable device 50 shown in FIG. 10C to the base 210 to a state as that shown in FIG. 15, so that the included angle between the rotating element 220 and the base 210 is smaller than the included angle A3 of FIG. 10B, and now the first push block 252 is no longer pushed by the actuation portion 222 of the rotating element 220. Then, the user can push the sliding element 230 located at the second position P4, and the sliding element 230 is pushed to resist the elastic force of the second elastic elements 260 and move to the position P3 shown in FIG. 12B, so as to drive the positioning hole 234 to align with the positioning element 254. Now, since the first push block 252 is no longer pushed by the actuation portion 222 of the rotating element 220, the positioning element 254 in the state as that shown in FIG. 12B can be recovered to the state of FIG. 12A through the elastic force of the first elastic element 256 to push the first push block 252 through the second push block 258 and insert in the positioning hole 234, so as to position the sliding element 230 to the first position P3.

In other embodiments, the linkage mechanism 150 shown in FIG. 4A to FIG. 4C can be applied to the electronic device 200 of FIG. 9A, and the linkage mechanism 250 shown in FIG. 12A to FIG. 12C can be applied to the electronic device 100 of FIG. 1A, which is not limited by the invention.

In other embodiments, the linkage mechanism can be other mechanisms through which the rotating element can actuate or drive the sliding element to slide, for example, a rod structure or a level push mechanism, which is not limited by the invention.

In summary, in the electronic device of the invention, when the user adjusts the angle of the rotating element to make the included angle between the rotating element and the base greater than the specific angle, the sliding element slides relative to the base to change the center of gravity of the electronic device. In this way, in case that the included angle between the rotating element (and the portable device combined with the rotating element) and the base is relatively large, the center of gravity of the electronic device can be adjusted to a suitable position along with a displacement of the sliding element, so as to avoid unstable center of gravity of the whole structure and improve usage convenience of the electronic device.

Moreover, the functional element of the electronic device can be hidden in the base or exposed along with movement of the sliding element. When the functional element is hidden in the base, contamination of the functional element is avoided, and the electronic device may have a better appearance.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An electronic device, comprising:
   a base;
   a rotating element, pivoted to the base;
   a sliding element, slidably disposed on the base, wherein when the rotating element is rotated relative to the base and an included angle between the rotating element and the base is greater than a specific angle, the sliding element slides from a first position to a second position relative to the base; and
   a linkage mechanism, wherein the linkage mechanism comprises:
      a first push block, slidably disposed on the base along a first direction;
      a positioning element, slidably disposed on the base along a second direction; and
      a first elastic element, connected between the positioning element and the base, wherein when the included angle between the rotating element and the base is smaller than the specific angle, and the sliding element is located at the first position, the first elastic element pushes the positioning element to lean against the sliding element to position the sliding element, and when the included angle between the rotating element and the base is greater than the specific angle, the rotating element pushes the first push block, and the first push block drives the positioning element to make the positioning element resisting an elastic force of the first elastic element to move away from the sliding element.

2. The electronic device as claimed in claim 1, wherein the rotating element actuates the sliding element to slide.

3. The electronic device as claimed in claim 1, wherein a center of gravity of the electronic device is changed along with a displacement of the sliding element.

4. The electronic device as claimed in claim 1, wherein the specific angle is 90 degrees.

5. The electronic device as claimed in claim 1, wherein a portable device is adapted to be installed to the rotating element, when the rotating element is rotated relative to the base and the included angle between the rotating element and the base is greater than the specific angle, the sliding element slides from the first position to the second position relative to the base, so as to change a center of gravity of the electronic device and the portable device.

6. The electronic device as claimed in claim 1, wherein the rotating element is adjacent to a backend of the base, and when the sliding element slides from the first position to the second position, the sliding element protrudes out from the backend.

7. The electronic device as claimed in claim 1, further comprising at least one functional element disposed on the base or the sliding element, wherein when the sliding element is located at the first position, the functional element is hidden, and when the sliding element is located at the second position, the functional element is exposed.

8. The electronic device as claimed in claim 7, wherein the functional element is disposed on the sliding element, when the sliding element is located at the first position, at least a part of the sliding element is accommodated in the base to hide the functional element, and when the sliding element is located at the second position, at least a part of the sliding element protrudes out from the base to expose the functional element.

9. The electronic device as claimed in claim 7, wherein the functional element is disposed on the base, the sliding element has a shielding portion, when the sliding element is located at the first position, the shielding portion shields the functional element, and when the sliding element is located at the second position, the shielding portion moves away from the functional element.

10. The electronic device as claimed in claim 9, wherein the sliding element is slidably disposed at a backend of the base, the functional element is disposed at a side edge of the base, and the shielding portion extends to the side edge from the backend.

11. The electronic device as claimed in claim 7, wherein the functional element is a connection port, a speaker or a stylus.

12. The electronic device as claimed in claim 7, wherein a number of the at least one functional element is plural, a part of the functional elements are disposed on the base, and a part of the functional elements are disposed on the sliding element, when the sliding element is located at the first position, the functional elements are hidden, and when the sliding element is located at the second position, the functional elements are exposed.

13. The electronic device as claimed in claim 1, further comprising a second elastic element connected between the sliding element and the base, wherein when the positioning element moves away from the sliding element, the sliding element slides to the second position through an elastic force of the second elastic element.

14. The electronic device as claimed in claim 1, wherein the first push block has a first slope, the positioning element has a second slope, when the rotating element pushes the first push block to move along the first direction, the first slope pushes the second slope to drive the positioning element to move along the second direction.

15. The electronic device as claimed in claim 1, wherein the first push block has a first slope, the positioning element has a second slope, the linkage mechanism further comprises a second push block, the second push block has a third slope and a fourth slope, and is slidably disposed on the base along a third direction, when the rotating element pushes the first push block to move along the first direction, the first slope pushes the third slope to drive the second push block to move along the third direction, and the fourth slope pushes the second slope to drive the positioning element to move along the second direction.

16. The electronic device as claimed in claim 1, wherein the sliding element has a positioning hole, and the positioning element is adapted to be inserted in the positioning hole.

17. The electronic device as claimed in claim 16, wherein when the sliding element is located at the second position, the positioning hole and the positioning element are mis-aligned, when the included angle between the rotating element and the base is smaller than the specific angle, the sliding element located at the second position is adapted to move to the first position under a stress, and drives the positioning hole to align with the positioning element, and the positioning element is inserted to the positioning hole through the elastic force of the elastic element.

18. The electronic device as claimed in claim 1, wherein the rotating element has an actuation portion, when the included angle between the rotating element and the base is greater than the specific angle, the actuation portion pushes the first push block and drives the first push block to move along the first direction, and the first push block drives the positioning element to move along the second direction.

19. The electronic device as claimed in claim 18, wherein the actuation portion is a bump.

\* \* \* \* \*